(12) United States Patent
Nishisaka

(10) Patent No.: US 10,698,316 B2
(45) Date of Patent: Jun. 30, 2020

(54) TARGET GENERATION DEVICE REPLACEMENT TROLLEY, TARGET GENERATION DEVICE REPLACEMENT SYSTEM, AND TARGET GENERATION DEVICE REPLACEMENT METHOD

(71) Applicant: Gigaphoton Inc., Tochigi (JP)

(72) Inventor: Toshihiro Nishisaka, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/379,363

(22) Filed: Apr. 9, 2019

(65) Prior Publication Data

US 2019/0271914 A1 Sep. 5, 2019

Related U.S. Application Data

(63) Continuation of application No. PCT/JP2016/084029, filed on Nov. 17, 2016.

(51) Int. Cl.
*G03F 7/20* (2006.01)
*G21K 5/08* (2006.01)
*H05G 2/00* (2006.01)

(52) U.S. Cl.
CPC .......... *G03F 7/2004* (2013.01); *G03F 7/2022* (2013.01); *G03F 7/2053* (2013.01); *G03F 7/70* (2013.01); *G21K 5/08* (2013.01); *H05G 2/00* (2013.01)

(58) Field of Classification Search
USPC .................................................. 250/504 R
See application file for complete search history.

(56) References Cited

U.S. PATENT DOCUMENTS

2008/0104828 A1 5/2008 Someya et al.
2010/0193711 A1 8/2010 Watanabe et al.
2012/0119118 A1 5/2012 Watanabe et al.
(Continued)

FOREIGN PATENT DOCUMENTS

JP H07-253499 A 10/1995
JP 2001-133597 A 5/2001
(Continued)

OTHER PUBLICATIONS

International Search Report issued in PCT/JP2016/084029; dated Feb. 14, 2017.
(Continued)

*Primary Examiner* — Kiet T Nguyen
(74) *Attorney, Agent, or Firm* — Studebaker & Brackett PC

(57) ABSTRACT

A target generation device replacement trolley includes: A. a linear movement mechanism configured to hold a target generation device configured to output a target material and linearly move the target generation device in a direction in which the target material is output; and B. a positioning portion configured to position the linear movement mechanism relative to a mounting part of a chamber on which the target generation device is mounted. The target generation device replacement trolley further includes C. a drive unit configured to drive the linear movement mechanism. The target generation device replacement trolley further includes D. a mount configured to hold the linear movement mechanism. The positioning portion is provided to the mount.

20 Claims, 20 Drawing Sheets

(56) References Cited

U.S. PATENT DOCUMENTS

| | | | |
|---|---|---|---|
| 2013/0032640 A1* | 2/2013 | Yabu | B05B 15/52 239/13 |
| 2014/0008552 A1 | 1/2014 | Umeda et al. | |
| 2014/0332700 A1 | 11/2014 | Igarashi et al. | |
| 2019/0159327 A1* | 5/2019 | Yanagida | H05G 2/006 |

FOREIGN PATENT DOCUMENTS

| | | |
|---|---|---|
| JP | 2001-350000 A | 12/2001 |
| JP | 2008-108599 A | 5/2008 |
| JP | 2008-118020 A | 5/2008 |
| JP | 2009-006802 A | 1/2009 |
| JP | 2011-029587 A | 2/2011 |
| JP | 2011-508122 A | 3/2011 |
| JP | 2013-175431 A | 9/2013 |
| JP | 2014-010954 A | 1/2014 |
| WO | 2009-083644 A1 | 7/2009 |

OTHER PUBLICATIONS

International Preliminary Report on Patentability and Written Opinion issued in PCT/JP2016/084029; dated May 21, 2019.

* cited by examiner

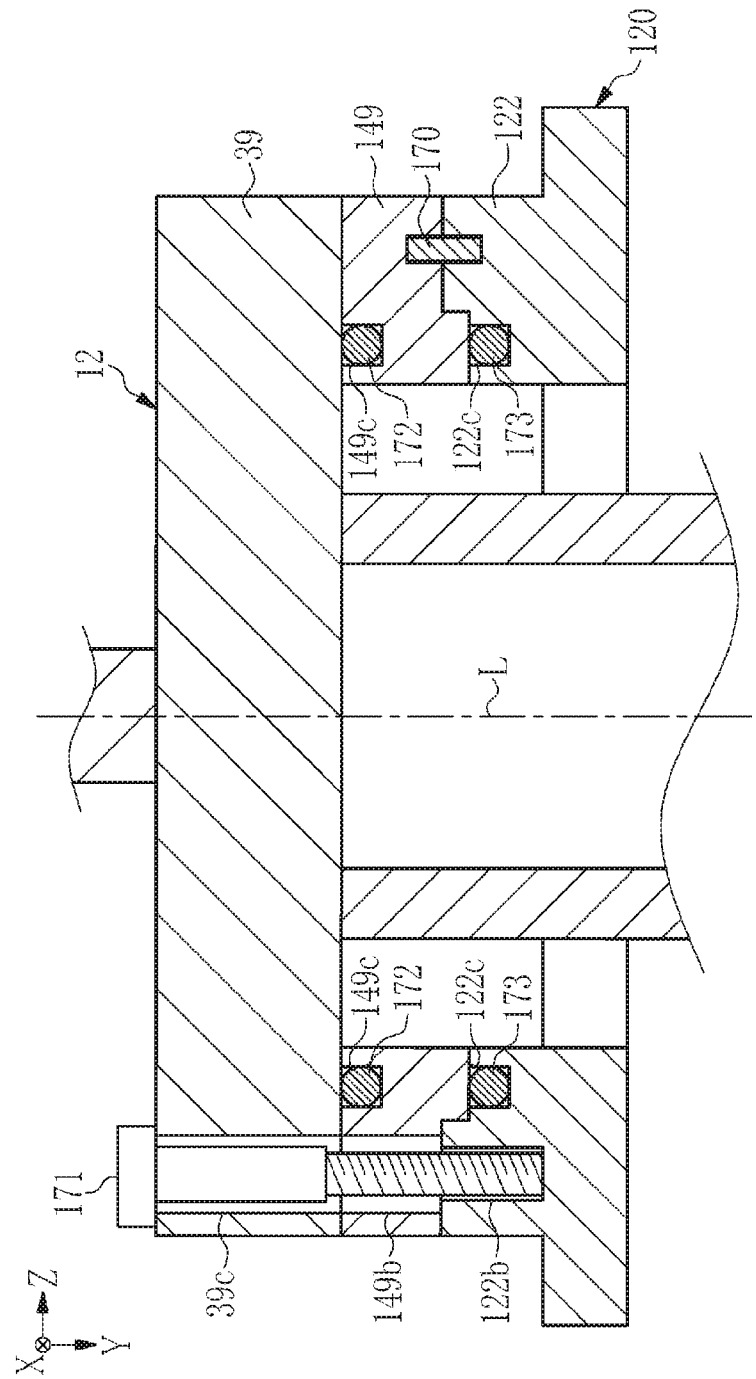

TARGET GENERATION DEVICE REPLACEMENT TROLLEY, TARGET GENERATION DEVICE REPLACEMENT SYSTEM, AND TARGET GENERATION DEVICE REPLACEMENT METHOD

CROSS-REFERENCE TO RELATED APPLICATIONS

The present application is a continuation application of International Application No. PCT/JP2016/084029 filed on Nov. 17, 2016. The content of the application is incorporated herein by reference in its entirety.

BACKGROUND

1. Technical Field

The present disclosure relates to a target generation device replacement trolley, a target generation device replacement system, and a target generation device replacement method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request, it is desired to develop an exposure device including a device configured to generate extreme ultraviolet (EUV) light at a wavelength of 13 nm approximately in combination with reduced projection reflective optics.

Disclosed EUV light generation devices include three kinds of devices of a laser produced plasma (LPP) device that uses plasma generated by irradiating a target material with a laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: Japanese Unexamined Patent Application Publication No. 2009-6802
Patent Document 2: National Publication of International Patent Application No. 2011-508122
Patent Document 3: Japanese Unexamined Patent Application Publication No. 2008-118020
Patent Document 4: Japanese Unexamined Patent Application Publication No. 2014-10954

SUMMARY

A target generation device replacement trolley according to an aspect of the present disclosure includes:
A. a linear movement mechanism configured to hold a target generation device configured to output a target material and linearly move the target generation device in a direction in which the target material is output; and
B. a positioning portion configured to position the linear movement mechanism relative to a mounting part of a chamber on which the target generation device is mounted.

A target generation device replacement system according to another aspect of the present disclosure includes:
A. a target generation device replacement trolley including
A1. a linear movement mechanism configured to hold a target generation device configured to output a target material and linearly move the target generation device in a direction in which the target material is output, and
A2. a positioning portion configured to position the linear movement mechanism relative to a mounting part of a chamber on which the target generation device is mounted; and
B. a chamber-side interface that is provided to the mounting part and to which the target generation device is detachably fixed.

A target generation device replacement method according to another aspect of the present disclosure includes:
A. fixing a target generation device to a linear movement mechanism provided to a target generation device replacement trolley, the target generation device being configured to output a target material;
B. positioning the target generation device replacement trolley relative to a chamber on which the target generation device is mounted;
C. driving the linear movement mechanism to join the target generation device with the chamber; and
D. canceling the fixation between the linear movement mechanism and the target generation device.

BRIEF DESCRIPTION OF THE DRAWINGS

Embodiments of the present disclosure will be described below as examples with reference to the accompanying drawings.

FIG. 4A illustrates a state before the attachment; and FIG. 4B illustrates a state after the attachment.

FIG. 8C is an enlarged view of the vicinity of the chamber-side interface in FIG. 8B.

DESCRIPTION OF EMBODIMENTS

Figure 1:
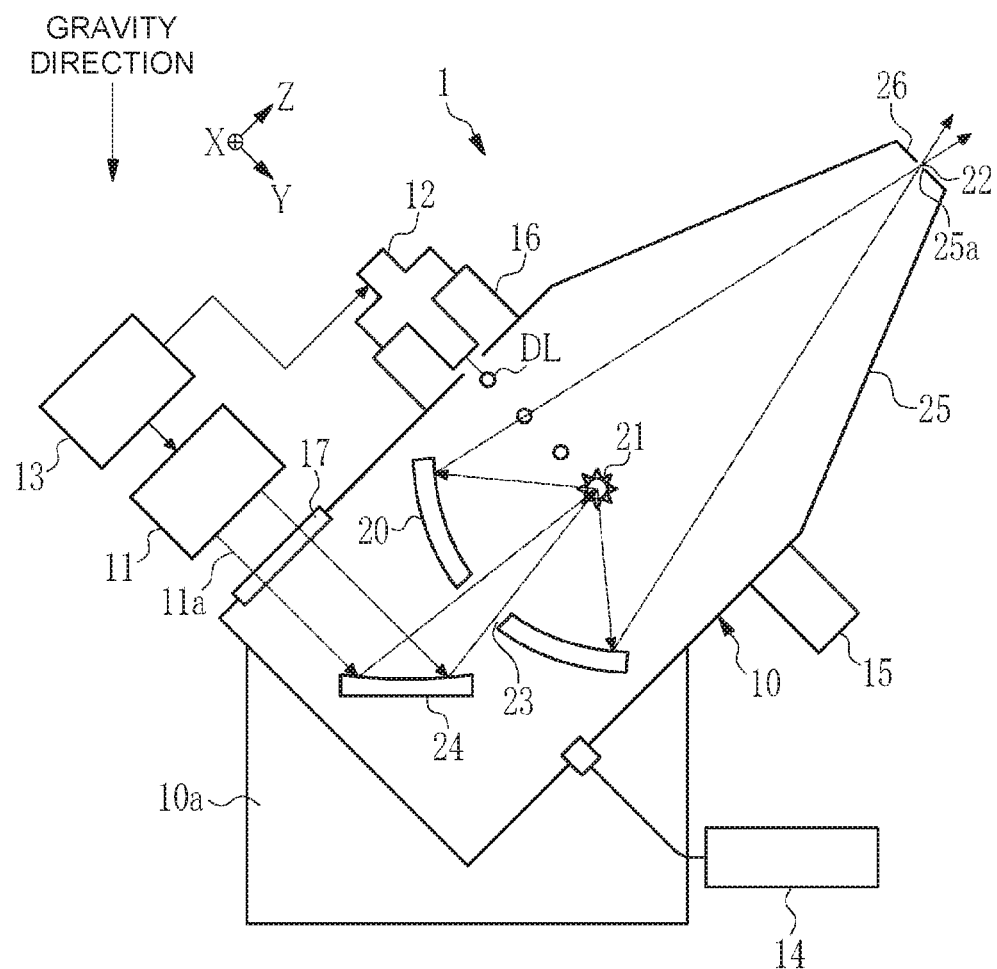
FIG. 1 is a schematic view illustrating the configuration of an EUV light generation device according to a comparative example.

<Contents>
1. Comparative example
1.1 EUV light generation device
1.1.1 Configuration
1.1.2 Operation
1.2 Target generation device
1.2.1 Configuration
1.2.2 Operation
1.3 Chamber movement mechanism
1.4 Target generation device replacement method
1.5 Problem
2. First embodiment
2.1 Configuration
2.1.1 Target generation device replacement system
2.1.2 Trolley-side interface
2.1.3 Trolley-side interface adjustment mechanism
2.1.4 Chamber-side interface
2.2 Operation
2.3 Effect
3. Second embodiment
3.1 Configuration
3.1.1 EUV light generation device
3.1.2 Target generation device replacement system
3.2 Operation Embodiments of the present disclosure will be described below in detail with reference to the accompanying drawings. The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Comparative Example
1.1 EUV Light Generation Device
1.1.1 Configuration

An EUV light generation device 1 employs a laser-produced plasma (LPP) scheme in which EUV light is produced by exciting a target material through irradiation with a laser beam. In FIG. 1, the EUV light generation device 1 includes a chamber 10, a driver laser 11, a target generation device 12, and a control unit 13.

The chamber 10 is a sealable container. The driver laser 11 is a master oscillator power amplifier type laser device configured to generate a drive pulse laser beam 11a used to excite the target material. The target generation device 12 supplies the target material into the chamber 10. The target generation device 12 is connected with the chamber 10 through a mounting part 16 provided to the chamber 10.

The target material may be, solid, liquid, or gas. The target generation device 12 may supply the target material into the chamber 10 in a well-known form such as jet or a droplet. In the present comparative example, the target generation device 12 supplies the target material as a droplet DL into the chamber 10. The target generation device 12 uses, for example, melted tin (Sn) as the target material. The target material is not limited to tin but may be terbium, gadolinium, lithium, or xenon, or may include a combination of two materials or more.

At least one through-hole is provided to the wall of the chamber 10. The through-hole is blocked by a window 17. The pulse laser beam 11a output from the driver laser 11 transmits through the window 17. For example, an EUV condenser mirror 20 having a spheroidal surface is disposed inside the chamber 10. The EUV condenser mirror 20 has first and second focal points. For example, a multi-layer reflective film obtained by alternately stacking molybdenum and silicon is formed on the surface of the EUV condenser mirror 20. The EUV condenser mirror 20 is disposed so that, for example, the first focal point is positioned in a plasma generation region 21, and the second focal point is positioned at an intermediate focus point (IF) 22. A through-hole 23 is provided at a central part of the EUV condenser mirror 20.

In addition, a laser beam condenser mirror 24 is provided inside the chamber 10. The pulse laser beam 11a incident inside the chamber 10 from the driver laser 11 through the window 17 is reflected by the laser beam condenser mirror 24 and passes through the through-hole 23.

The EUV light generation device 1 also includes a connection part 25 that provides communication between the inside of the chamber 10 and the inside of an exposure device 2 to be described later. The connection part 25 is formed in a substantially conical shape having a diameter that decreases as the position moves from the plasma generation region 21 toward the intermediate focus point 22. A wall 26 at which an aperture 25a is formed is provided to a leading end part of the connection part 25. The wall 26 is disposed so that the aperture 25a is positioned at the intermediate focus point 22.

The control unit 13 is connected with the driver laser 11 and the target generation device 12, and provides synchronization between the timing of outputting of the pulse laser beam 11a by the driver laser 11 and the timing of outputting of the droplet DL by the target generation device 12.

The EUV light generation device 1 also includes an etching gas supply device 14 and an exhaust device 15 connected with the chamber 10.

In addition, the EUV light generation device 1 includes a chamber mount 10a shaped in accordance with the shape of the chamber 10. The chamber mount 10a holds the chamber 10 in such a posture in which the optical axis of the EUV light emitted from the EUV condenser mirror 20 is oblique to the direction of gravity. This is because the optical axis of the exposure device 2 is oblique to the direction of gravity. The chamber 10 does not need to be tilted when a tilted mirror is provided in the EUV light generation device 1 to align the optical axis of the EUV light with the optical axis of the exposure device 2. However, the reflectance of the EUV light by the tilted mirror is 60% approximately, and thus the use efficiency of the EUV light is reduced when the tilted mirror is provided. For this reason, no tilted mirror is provided, but the chamber 10 is tilted.

When fitted to the chamber mount 10a, the chamber 10 is correctly held in a posture in which the optical axis of the EUV light aligns with the optical axis of the exposure device 2.

Hereinafter, the direction of the optical axis of the EUV light emitted from the EUV condenser mirror 20 is referred to as a Z direction, and the output direction of the droplet DL output from the target generation device 12 is referred to as a Y direction. The Z direction and the Y direction are orthogonal to each other. In addition, a direction orthogonal to the Z direction and the Y direction is referred to as an X direction. The X direction is orthogonal to the direction of gravity.

In the present comparative example, the mounting part 16 is provided to the chamber 10 to hold the target generation device 12 in a posture in which the Y direction as the output direction of the droplet DL is not parallel nor orthogonal to the direction of gravity.

1.1.2 Operation

The following describes the operation of the EUV light generation device 1 with reference to FIG. 1. The pulse laser beam 11a output from the driver laser 11 transmits through the window 17 and is incident in the chamber 10. Then, the pulse laser beam 11a is reflected by the laser beam condenser mirror 24, passes through the through-hole 23, and is condensed in the plasma generation region 21.

The target generation device 12 outputs the droplet DL toward the plasma generation region 21. The droplet DL is irradiated with at least one pulse included in the pulse laser beam 11a. The droplet DL irradiated with the pulse laser beam 11a turns into plasma, and radiation light is emitted from the plasma. The EUV light included in the radiation light is selectively reflected by the EUV condenser mirror 20. The EUV light reflected by the EUV condenser mirror 20 is condensed at the intermediate focus point 22 and output to the exposure device 2.

Through repetition of the above-described operation, for example, debris of the droplet DL is gradually accumulated on the EUV condenser mirror 20 and the like in the chamber 10, and thus cleaning operation is performed to remove the debris as appropriate. The cleaning operation may be performed during the EUV light generation operation or while the EUV light generation operation is stopped. In the cleaning operation, etching gas is supplied into the chamber 10 from the etching gas supply device 14. When the droplet DL is tin, the etching gas preferably contains hydrogen. Stannane generated through reaction between the etching gas and the debris or the like, and the etching gas not reacted with the debris or the like are discharged by the exhaust device 15. The exhaust device 15 maintains the inside of the chamber 10 at low pressure.

1.2 Target Generation Device 1.2.1 Configuration

Figure 2:
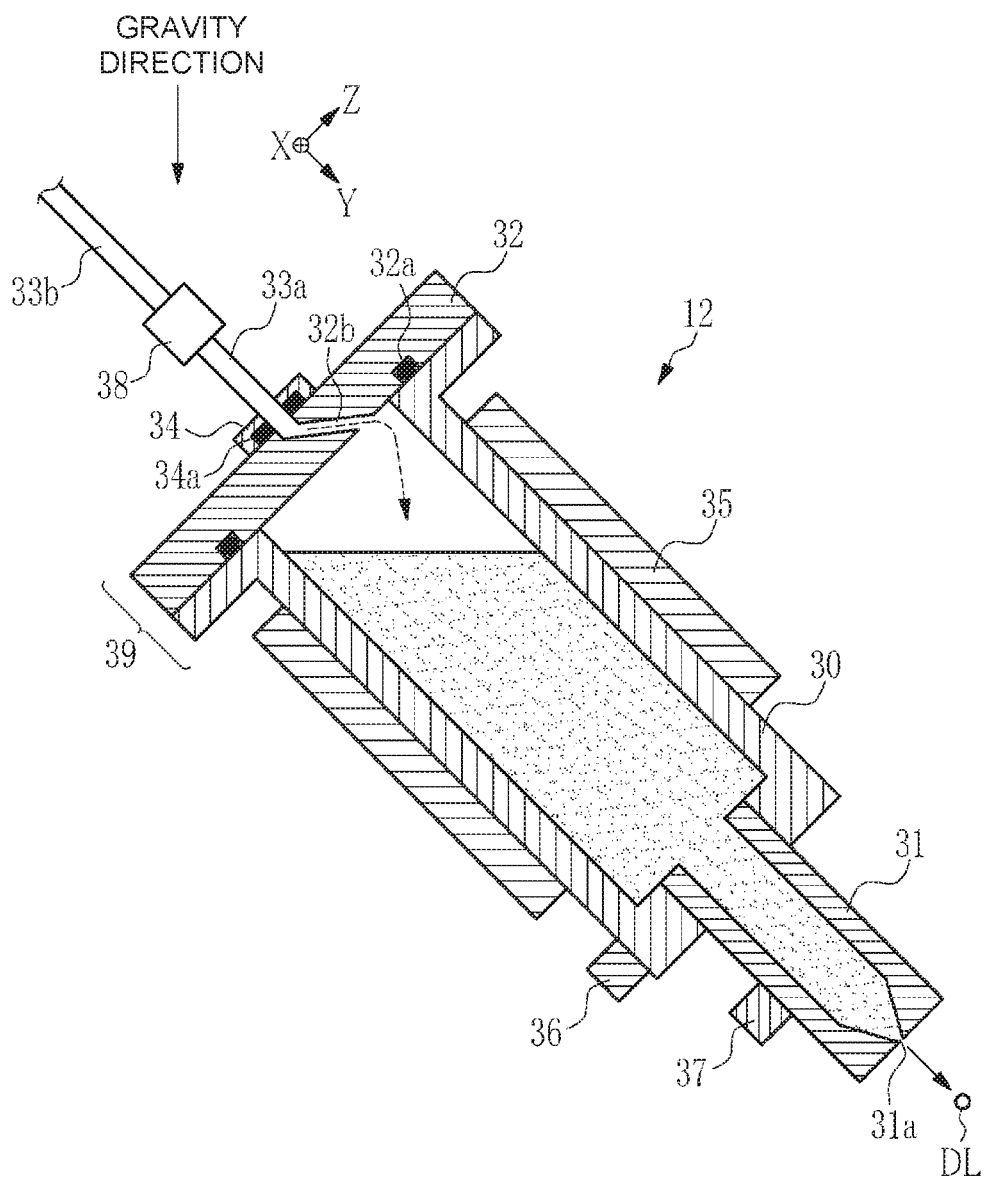
FIG. 2 is a cross-sectional view illustrating the configuration of a target generation device.

In FIG. 2, the target generation device 12 includes a tank 30, a nozzle 31, a lid 32, a pipe 33a, a heater 35, a temperature sensor 36, and a piezoelectric element 37. The tank 30 is a tubular member made of, for example, molybdenum and houses the target material inside. The nozzle 31 is made of, for example, molybdenum and connected with one end of the tank 30. A nozzle hole 31a through which the target material is output as the droplet DL is formed at a leading end part of the nozzle 31.

The lid 32 is made of, for example, molybdenum and connected with the other end of the tank 30. The lid 32 has a disk shape and is joined with an end part of the tank 30 through an O ring 32a. The lid 32 includes a gas flow path 32b through which inert gas circulates. In addition, the lid 32 is connected with, through an O ring 34a, a flange 34 provided at an end part of the pipe 33a. The pipe 33a is communicated with the gas flow path 32b. The pipe 33a is connected with, through a joint 38, a pipe 33b connected with a pressure adjuster (not illustrated). The inert gas is supplied from a gas tank included in the pressure adjuster into the tank 30 through the pipe 33b, the pipe 33a, and the gas flow path 32b.

The lid 32 and the end part of the tank 30 form a connection part 39 to be connected with a trolley-side interface 141 to be described later.

The heater 35 is provided on the outer peripheral surface of the tank 30, and heats the tank 30 to melt the target material containing tin in the tank 30. The temperature sensor 36 is disposed near the nozzle 31 on the outer peripheral surface of the tank 30, and detects the temperature of the tank 30 near the installation position of the temperature sensor 36. The piezoelectric element 37 is provided on the outer peripheral surface of the nozzle 31, and provides vibration to the nozzle 31. The heater 35, the temperature sensor 36, and the piezoelectric element 37 are connected with the control unit 13 described above.

1.2.2 Operation

The control unit 13 controls the temperature of the heater 35 to maintain the target material in the tank 30 at a predetermined temperature based on a temperature detection signal output from the temperature sensor 36. The control unit 13 also controls the pressure adjuster to pressurize the inside of the tank 30 to a predetermined pressure by the inert gas, thereby outputting the target material containing melted tin through the nozzle hole 31a. The pressure inside the tank 30 in this case is, for example, 40 MPa approximately.

In addition, the control unit 13 supplies the piezoelectric element 37 with electrical power having a predetermined waveform to provide vibration to the nozzle 31, and provide disturbance to the target material output from the nozzle hole 31a, thereby generating the droplet DL. The speed, interval, and generation frequency of the droplet DL are controlled by the pressure in the tank 30 and the waveform provided to the piezoelectric element 37.

1.3 Chamber Movement Mechanism

When the EUV light generation device 1 is obliquely installed as described above, for maintenance of the EUV light generation device 1, it is not easy to remove the chamber 10 or part of the chamber 10 and move the chamber 10 or the part to a maintenance region. Thus, a movement mechanism is provided to move the chamber 10 being positioned relative to the exposure device 2 to the maintenance region.

Figure 3:
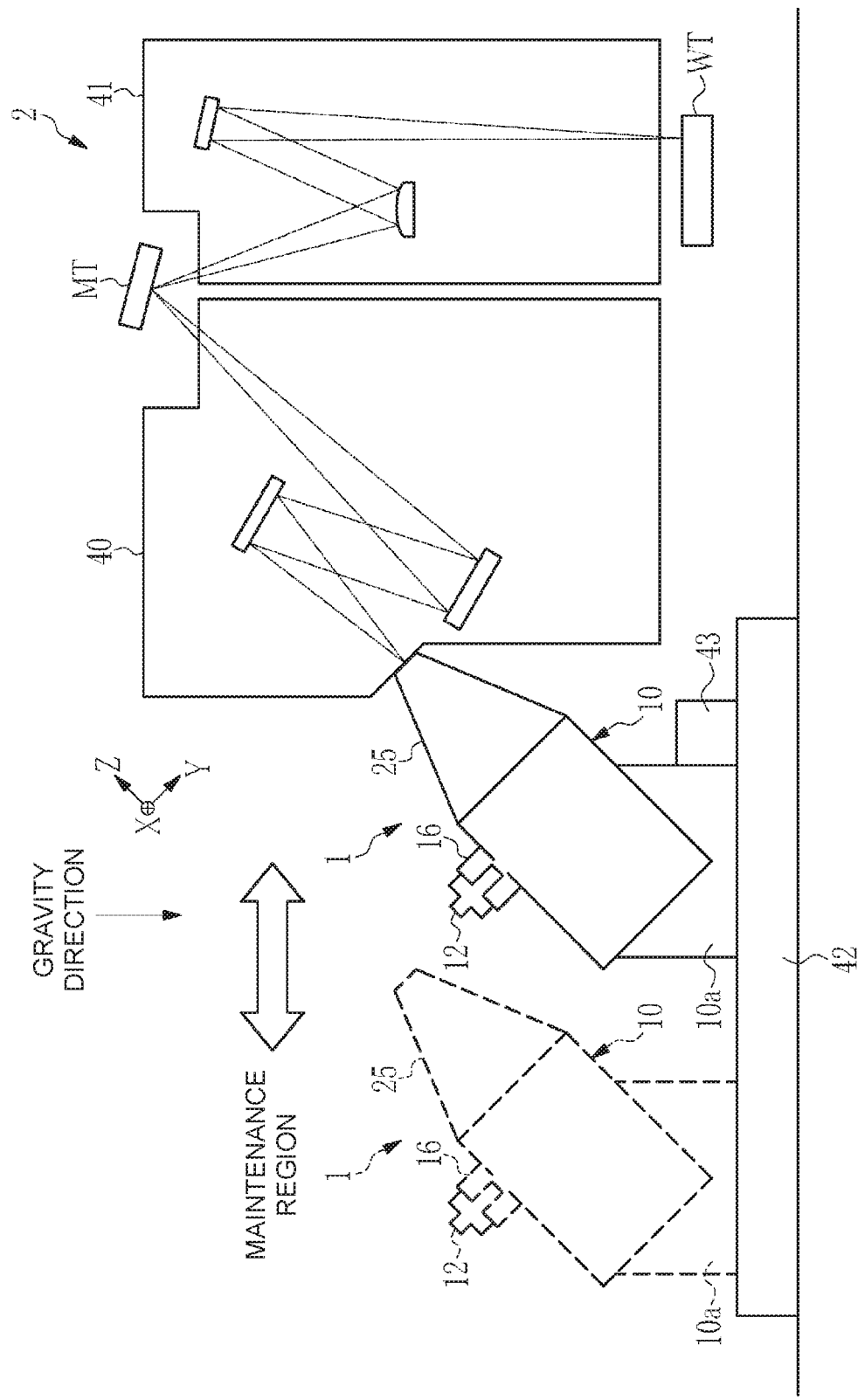
FIG. 3 is an explanatory diagram for description of a mechanism for moving a chamber relative to an exposure device.

In FIG. 3, the exposure device 2 includes a mask irradiation unit 40 and a workpiece irradiation unit 41. The mask irradiation unit 40 causes the EUV light incident from the EUV light generation device 1 to be incident on a mask pattern of a mask table MT through a reflective optical system. The workpiece irradiation unit 41 causes the EUV light reflected by the mask table MT to be imaged on a workpiece such as a semiconductor wafer (not illustrated) disposed on a workpiece table WT through the reflective optical system. The exposure device 2 moves the mask table MT and the workpiece table WT simultaneously in parallel to expose the workpiece through the mask pattern.

A movement mechanism 42 is provided to move the chamber 10, and a positioning mechanism 43 is provided to position the chamber 10 relative to the exposure device 2. The positioning mechanism 43 positions the chamber mount 10a so that the chamber 10 is positioned at a predetermined position at which the optical axis of the EUV light emitted from the EUV light generation device 1 coincides with the optical axis of the mask irradiation unit 40. FIG. 3 illustrates, with solid lines, a state in which the chamber 10 is positioned at the predetermined position at which the optical axis of the EUV light coincides with the optical axis of the mask irradiation unit 40.

The movement mechanism 42 moves the chamber 10 between the position at which the chamber 10 is positioned by the positioning mechanism 43 and the maintenance region in which maintenance is possible. The movement mechanism 42 includes, for example, a rail (not illustrated) and a slider slidably provided to the rail. The movement mechanism 42 may be provided with a wheel in place of the slider. FIG. 3 illustrates, with dashed lines, a state in which the chamber 10 is moved to the maintenance region.

1.4 Target Generation Device Replacement Method

Kinds of maintenance performed in the maintenance region include replacement of the target generation device 12. The target generation device 12 needs to be replaced when the target material housed in the tank 30 is all output from the nozzle 31 or the remaining amount thereof becomes equal to or smaller than a predetermined amount.

To replace the target generation device 12, first, the chamber 10 is moved to the maintenance region by the movement mechanism 42. Then, in the maintenance region, the target generation device 12 currently mounted at the mounting part 16 of the chamber 10 is removed.

Figure 4A:
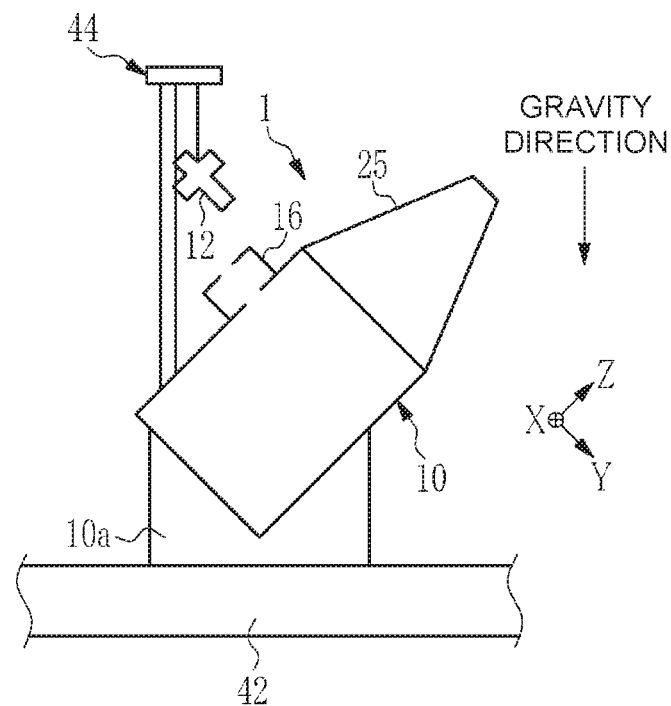
FIGS. 4A and 4B are diagrams for description of a method of attaching the target generation device.
Figure 4B:
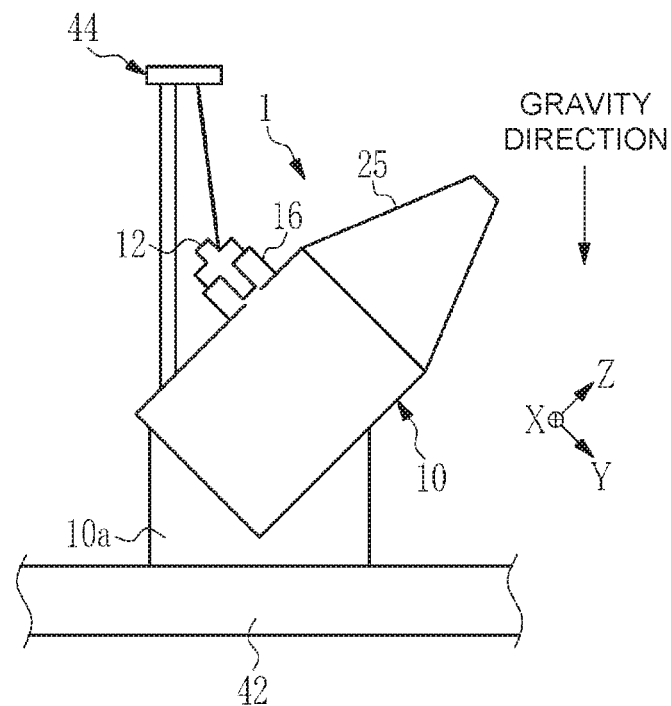

FIGS. 4A and 4B are diagrams for description of a method of attaching the target generation device 12. To attach the target generation device 12 to the mounting part 16 of the chamber 10, first, the target generation device 12 in which the tank 30 is filled with the target material is suspended by a crane 44 as illustrated in FIG. 4A. The crane 44 is disposed near the chamber 10 in the maintenance region. While the target generation device 12 is suspended by the crane 44, a worker mounts the target generation device 12 on the mounting part 16 as illustrated in FIG. 4B while secondarily holding the target generation device 12. Then, the worker fixes the target generation device 12 to the mounting part 16 by, for example, a bolt (not illustrated) while holding airtightness between the target generation device 12 and the mounting part 16 through, for example, an O ring (not illustrated).

The chamber 10, the target generation device 12 of which is replaced as described above is moved, by the movement mechanism 42, to the position at which the chamber 10 is positioned by the positioning mechanism 43.

1.5 Problem

The operation time of the EUV light generation device 1 is desired to be extended as much as possible. The operation time of the EUV light generation device 1 depends on the capacity of the tank 30 of the target generation device 12, and thus the capacity of the tank 30 needs to be increased to extend the operation time. For example, the current capacity of the tank 30 is 800 cc approximately, but it is considered to increase the capacity to approximately 3200 cc in order to extend the operation time.

In addition, the power of the EUV light from the EUV light generation device 1 is desired to be increased. To increase the power of the EUV light, the power of the pulse laser beam 11a from the driver laser 11 needs to be increased. The increase in the power of the pulse laser beam 11a leads to increase in the influence range of debris from plasma generated through irradiation of the droplet DL with the pulse laser beam 11a in the plasma generation region 21.

The increase in the debris influence range subsequently disturbs the trajectory of the droplet DL flying to the plasma generation region 21, and as a result, the droplet DL is potentially not appropriately irradiated with the pulse laser beam 11a in the plasma generation region 21. Consequently, the power of the EUV light is destabilized. To prevent this destabilization, for example, increasing the interval of droplets DL is considered. The increase in the interval of droplets DL leads to increase in the emission time interval of the EUV light. To prevent this, the pressure in the tank 30 due to the inert gas needs to be increased to speed up the droplet DL. To increase the pressure in the tank 30, the wall thickness of the tank 30 needs to be increased so that the pressure resistance of the tank 30 is improved. As a result, the weight of the tank 30 is increased.

For example, the tank 30 currently has a capacity of 800 cc approximately and a weight of 95 kg approximately. When the capacity of the tank 30 is increased to 3200 cc approximately for the above-described reason, the weight increases to 300 kg approximately. When the weight of the tank 30 is increased in this manner due to increase in the capacity, the above-described replacement method of the target generation device 12, which is performed by the worker secondarily holding the target generation device 12 suspended by the crane 44, suffers limitations and difficulties.

2. First Embodiment

The following describes a target generation device replacement system according to a first embodiment of the present disclosure. In the first embodiment, the target generation device is replaced by using the target generation device replacement system in place of the crane 44 described in the comparative example. The configuration of the EUV light generation device is substantially identical to the configuration of the EUV light generation device 1 according to the comparative example. In the following description, any component same as that in the comparative example is denoted by an identical reference sign, and description thereof is omitted as appropriate.

2.1 Configuration 2.1.1 Target Generation Device Replacement System

Figure 5:
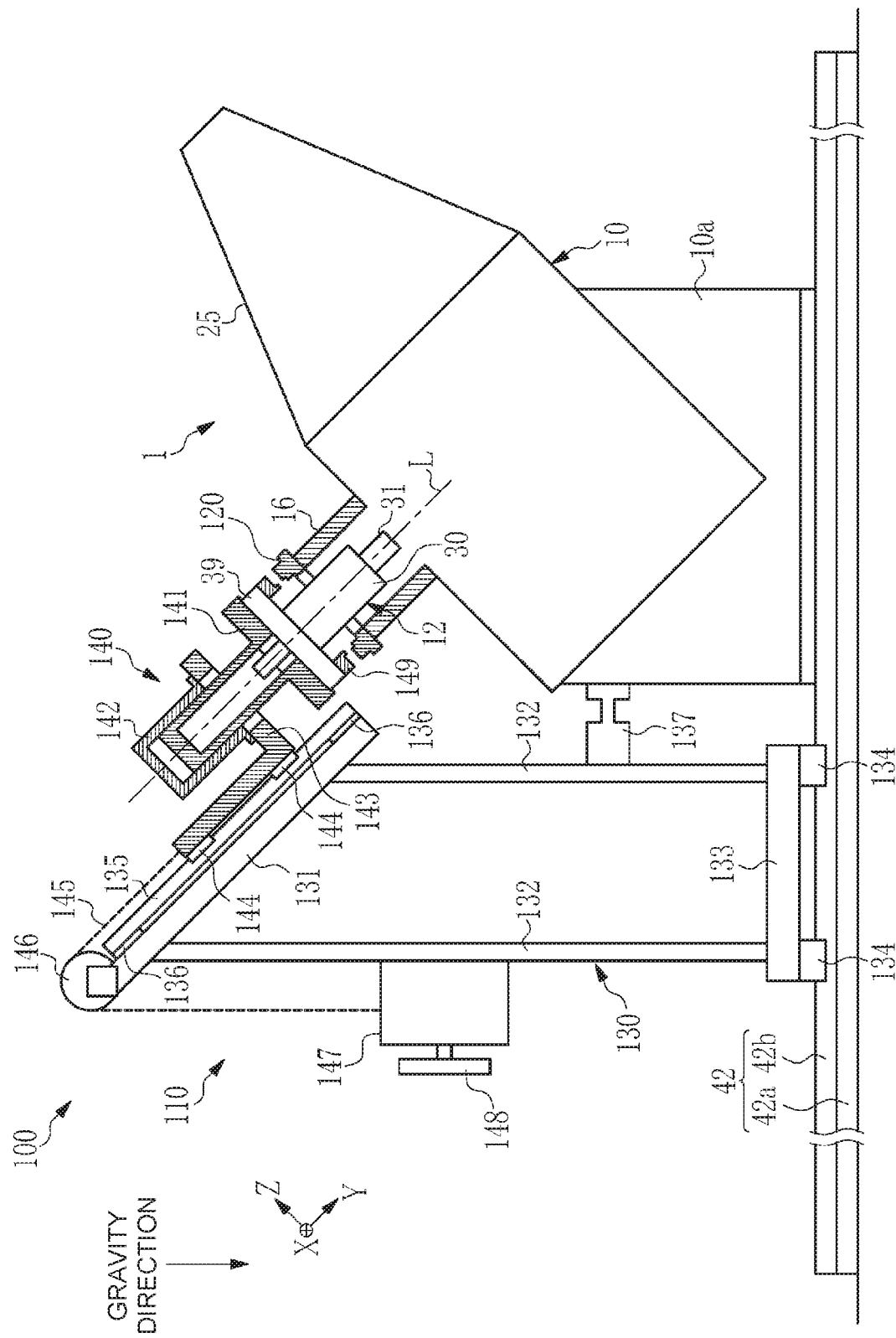
FIG. 5 is a schematic view illustrating the configuration of a target generation device replacement system according to a first embodiment.

FIG. 5 schematically illustrates the configuration of a target generation device replacement system 100 according to the first embodiment. In FIG. 5, the target generation device replacement system 100 includes a target generation device replacement trolley 110 and a chamber-side interface 120. Hereinafter, the target generation device replacement system 100 is simply referred to as the replacement system 100, and the target generation device replacement trolley 110 is simply referred to as the trolley 110.

When the chamber 10 is combined with a mitigation mechanism that utilizes magnetic field, each component of the trolley 110 and the chamber-side interface 120 is preferably made of a non-magnetic material. The non-magnetic material is, for example, stainless steel such as SUS316.

The trolley 110 includes a mount 130 and a linear movement mechanism 140. FIG. 5 illustrates a cross-sectional view of the linear movement mechanism 140, the chamber-side interface 120, and the mounting part 16 taken along a YZ plane parallel to the Y direction and the Z direction.

The mount 130 includes a flat plate table 131, a plurality of frames 132, and a base 133. The flat plate table 131 is supported by the frames 132. The frames 132 are supported by the base 133. The table 131 is supported by the frames 132 so that the upper surface thereof is substantially parallel to the Y direction and the X direction. The base 133 is provided with a plurality of sliders 134.

The movement mechanism 42 configured to move the chamber 10 includes a base 42a installed on the floor, and one or a plurality of linear rails 42b installed on the base 42a. Each linear rail 42b extends in a direction orthogonal to the X direction in a horizontal plane orthogonal to the direction of gravity. The chamber mount 10a is movably provided to the linear rail 42b, which enables movement of the chamber 10 between the position at which the chamber 10 is positioned by the positioning mechanism 43 and the maintenance region.

The sliders 134 provided to the trolley 110 are slidably engaged with the linear rail 42b. The movement mechanism 42 allows the trolley 110 to move in the direction orthogonal to the X direction in the horizontal plane orthogonal to the direction of gravity. In place of the sliders 134, wheels engaged with the linear rails 42b may be provided to the trolley 110.

The trolley 110 is also provided with a positioning portion 137 configured to position the trolley 110 relative to the chamber 10. The positioning portion 137 is attached to, for example, the frames 132. The trolley 110 is positioned relative to the chamber 10 when the positioning portion 137 contacts the chamber mount 10a. FIG. 5 illustrates a state in which the trolley 110 is positioned by the positioning portion 137 relative to the chamber 10 disposed in the maintenance region. In this manner, the movement mechanism 42 functions as a trolley movement mechanism configured to move the trolley 110.

One or a plurality of linear rails 135 are provided on the upper surface of the table 131. Each linear rail 135 is substantially parallel to the Y direction. A gap is formed between the table 131 and the linear rail 135. A shim 136 as a rail adjustment member for adjusting the angle of the linear rail 135 can be inserted into and removed from the gap. The angle and height of the linear rail 135 can be finely adjusted by changing, for example, the thickness of the shim 136 inserted into the gap, the number thereof, and the insertion position thereof.

The linear movement mechanism 140 is connected with the linear rail 135 in a linearly movable manner in the Y direction. In other words, the mount 130 movably holds the linear movement mechanism 140 through the linear rail 135. The linear movement mechanism 140 includes the trolley-side interface 141, a housing 142, and a movement supporter 143. As described later in detail, the target generation device 12 described in the comparative example is detachably fixed to the trolley-side interface 141. The trolley-side interface 141 is held by the housing 142. The housing 142 is connected with the movement supporter 143.

The movement supporter 143 is provided with a plurality of sliders 144. The sliders 144 are slidably engaged with the linear rail 135. The movement supporter 143 is movable in the Y direction. The movement supporter 143 has an end part connected with one end of a line member 145 such as a chain or a wire. The other end of the line member 145 is connected with a winch 147 through a pulley 146 provided at an upper end part of the table 131 of the trolley 110. The line member 145, the pulley 146, and the winch 147 constitute a drive unit of the linear movement mechanism 140.

The winch 147 is attached to, for example, the frames 132 of the mount 130. The winch 147 is provided with a handle 148 for winding the line member 145. The linear movement mechanism 140 can be moved up and down along the linear rail 135 by rotating the handle 148. The manual winch 147 may be replaced with an electric winch.

The chamber-side interface 120 is an annular member that is provided at an opening end part of the mounting part 16 of the chamber 10 and to which the target generation device 12 is detachably fixed. The chamber-side interface 120 is fitted to an annular fitting part 149 provided to the target generation device 12.

2.1.2 Trolley-Side Interface

Figure 6A:
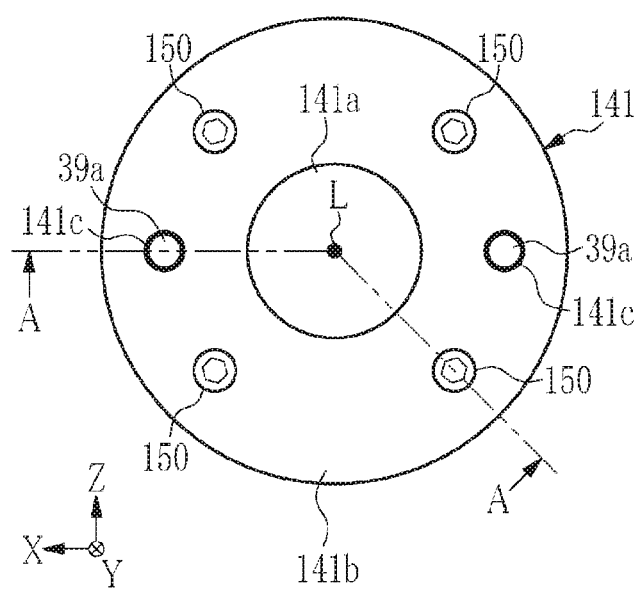
FIG. 6A is a plan view of a trolley-side interface when viewed in the negative Y direction.
Figure 6B:
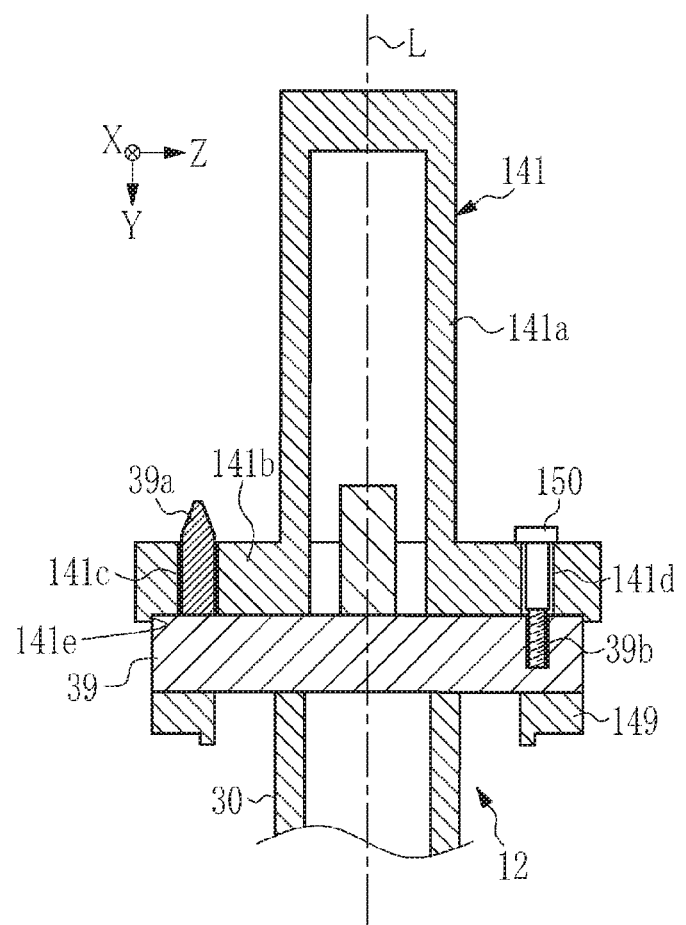
FIG. 6B is a cross-sectional view taken along line A-A in FIG. 6A.

FIGS. 6A and 6B are each a diagram illustrating the configuration of the trolley-side interface 141. FIG. 6A is a plan view of the trolley-side interface 141 when viewed in the negative Y direction. FIG. 6B is a cross-sectional view taken along line A-A in FIG. 6A.

The trolley-side interface 141 includes a bottomed cylindrical part 141a, and a ring part 141b formed at an opening end part of the cylindrical part 141a. The cylindrical part 141a and the ring part 141b are each substantially rotationally symmetric with respect to a central axis L parallel to the Y direction. The cylindrical part 141a includes two pin holes 141c and four through-holes 141d. The pin holes 141c may not penetrate through the ring part 141b.

Each pin hole 141c is formed at a position separated from the central axis L. Guide pins 39a formed in the target generation device 12 are inserted into the pin holes 141c. The guide pins 39a are provided at positions corresponding to the pin holes 141c at the upper surface of the connection part 39 of the target generation device 12. The target generation device 12 is positioned by the guide pins 39a in a rotational direction about the central axis L.

Fixation bolts 150 are inserted into the respective through-holes 141d. The connection part 39 of the target generation device 12 includes tap holes 39b at positions corresponding to the through-holes 141d. The trolley-side interface 141 and the connection part 39 are fastened to each other by screwing the bolts 150 into the tap holes 39b through the through-holes 141d.

A fitting part 141e is formed at a surface of the ring part 141b on the target generation device 12 side. The fitting part 141e has a concave surface perpendicular to the Y direction. An upper end part of the connection part 39 is fitted to the fitting part 141e. The target generation device 12 is positioned by the fitting part 141e in the Y direction as the moving direction of the linear movement mechanism 140. The annular fitting part 149 is formed at a lower end part of the connection part 39. The fitting part 149 is formed integrally with or separately from the connection part 39. When separately formed, the fitting part 149 is fixed to the connection part 39 while air-tightness is achieved.

2.1.3 Trolley-Side Interface Adjustment Mechanism

Figure 7A:
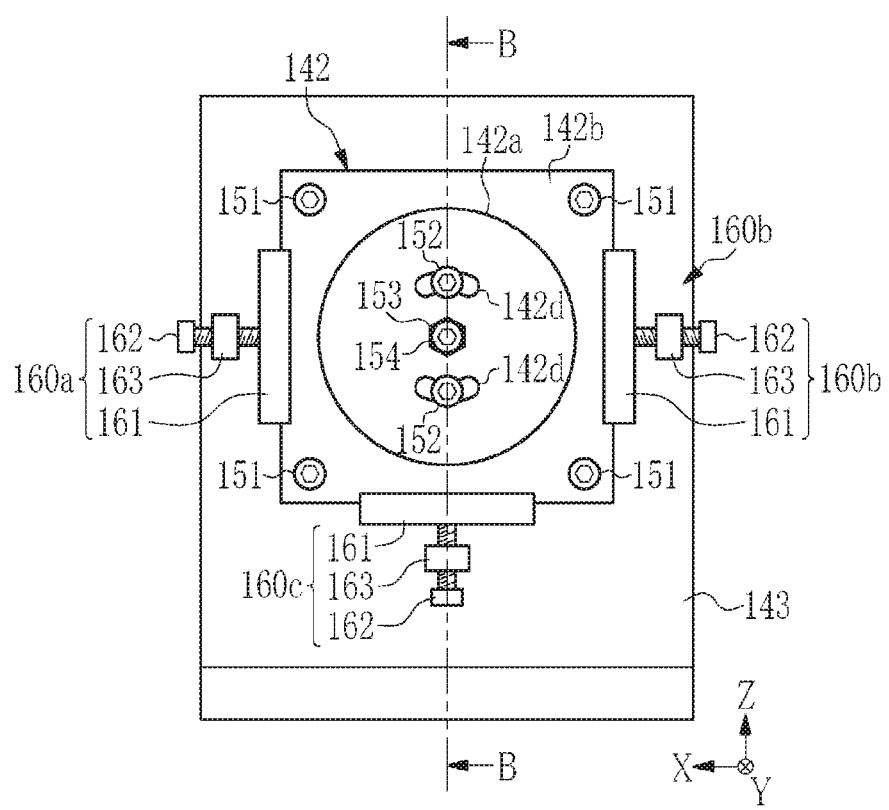
FIG. 7A is a plan view of a housing and a position adjustment mechanism when viewed in the negative Y direction.
Figure 7B:
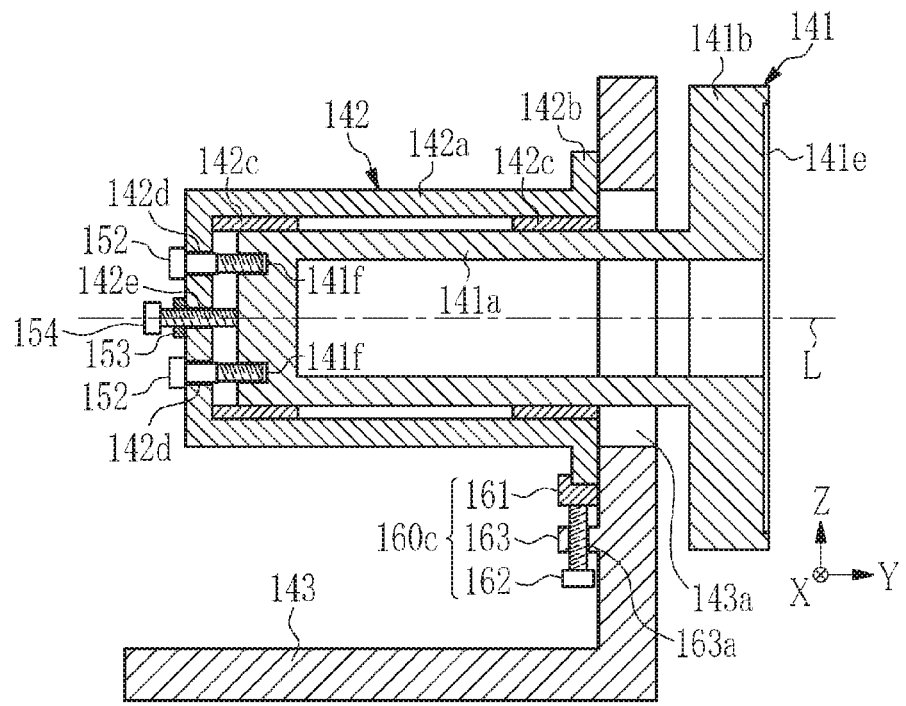
FIG. 7B is a cross-sectional view taken along line B-B in FIG. 7A.

FIGS. 7A and 7B illustrate the housing 142 and a position adjustment mechanism of the trolley-side interface 141. FIG. 7A is a plan view of the housing 142 and the position adjustment mechanism when viewed in the negative Y direction. FIG. 7B is a cross-sectional view taken along line B-B in FIG. 7A.

The housing 142 includes a bottomed cylindrical part 142a, and a flange part 142b formed at an opening end part of the cylindrical part 142a and having a rectangular outer shape. The cylindrical part 142a is substantially rotationally symmetric with respect to the central axis L. The housing 142 includes a bush 142c as a slide holding unit slidably holding the trolley-side interface 141 in the Y direction.

The movement supporter 143 has an L-shaped section and has an opening 143a into which the trolley-side interface 141 is inserted. The flange part 142b is disposed at a peripheral part of the opening 143a and fixed to the movement supporter 143 by four fixation bolts 151.

The cylindrical part 141a of the trolley-side interface 141 is inserted into the cylindrical part 142a of the housing 142 through the bush 142c. The cylindrical part 141a is fastened to the housing 142 by two rotation fixation bolts 152. Specifically, the cylindrical part 142a includes an arc slot 142d at a bottom part. The cylindrical part 141a includes a tap hole 141f at a bottom part.

The rotation fixation bolts 152 are screwed into the tap holes 141f through the slots 142d. When the rotation fixation bolts 152 are loosened, the trolley-side interface 141 can be rotated about the central axis L. The rotation angle of the trolley-side interface 141 can be adjusted by setting the trolley-side interface 141 to a desired rotation angle relative to the housing 142 and fastening the rotation fixation bolts 152. The rotation fixation bolts 152 and the slots 142d constitute a rotation adjustment mechanism with which the trolley-side interface 141 is rotated about the central axis L.

In addition, the bottom part of the cylindrical part 142a includes a penetrating tap hole 142e at a position corresponding to the central axis L. A press bolt 153 is screwed in the tap hole 142e through a fixation nut 154. A leading end part of the press bolt 153 contacts the cylindrical part 141a of the trolley-side interface 141. The position of the trolley-side interface 141 in the Y direction can be adjusted by adjusting the screw amount of the press bolt 153. Since the Y direction aligns with the moving direction of the linear movement mechanism 140, this adjustment is not essential.

The housing 142 includes a translation adjustment mechanism with which the trolley-side interface 141 is translated in the X and Z directions orthogonal to the Y direction. As illustrated in FIG. 7A, the housing 142 is provided with a first translation adjustment mechanism 160a, a second translation adjustment mechanism 160b, and a third translation adjustment mechanism 160c. The first to third translation adjustment mechanisms 160a to 160c each include a support member 161, a press bolt 162, and a protrusion 163. The first translation adjustment mechanism 160a and the second translation adjustment mechanism 160b are disposed facing each other in the X direction with the housing 142 interposed therebetween. The third translation adjustment mechanism 160c is disposed at one end of the housing 142 in the Z direction.

The support member 161 supports in contact with an end part of the flange part 142b of the housing 142. The protrusion 163 is formed integrally with the movement supporter 143 and includes a tap hole 163a. The press bolt 162 is screwed in the tap hole 163a, and has a leading end part in contact with the support member 161. The positions of the housing 142 and the trolley-side interface 141 relative to the movement supporter 143 can be adjusted in the X direction and the Z direction by adjusting the screw amount of each press bolt 162 while the fixation bolts 151 are loosened. The fixation bolts 151 are fastened again while the positions of the housing 142 and the trolley-side interface 141 are adjusted to desired positions.

2.1.4 Chamber-Side Interface

Figure 8A:
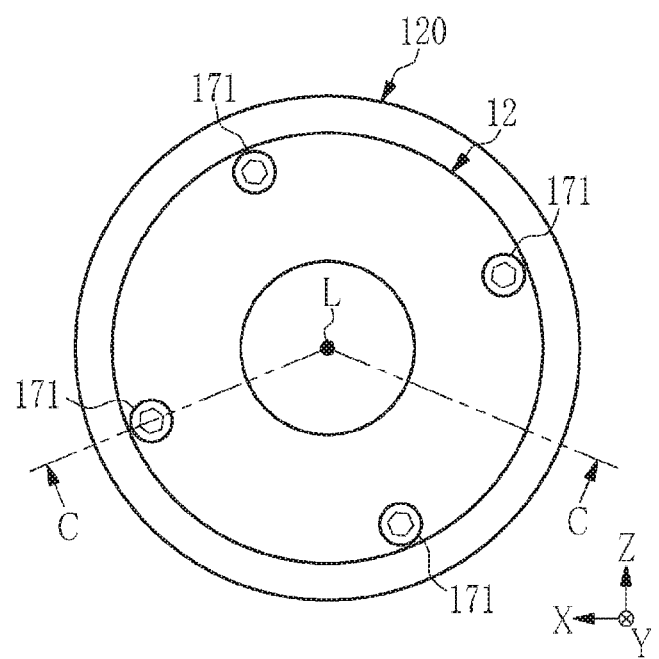
FIG. 8A is a plan view of a chamber-side interface and the target generation device when viewed in the negative Y direction.
Figure 8B:
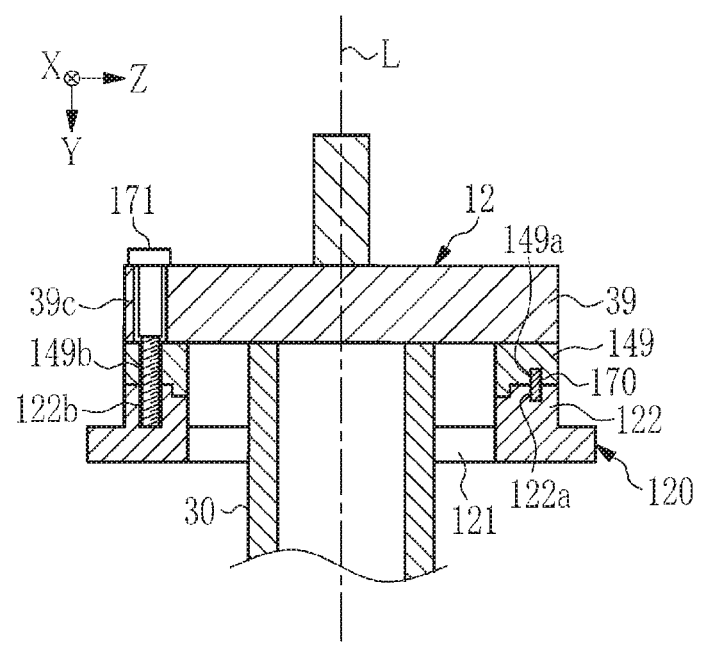
FIG. 8B is a cross-sectional view taken along line C-C in FIG. 8A.

FIGS. 8A, 8B, and 8C illustrate a state in which the target generation device 12 is removed from the trolley-side interface 141 and fixed to the chamber-side interface 120. FIG. 8A is a plan view of the chamber-side interface 120 and the target generation device 12 when viewed in the negative Y direction. FIG. 8B is a cross-sectional view taken along line C-C in FIG. 8A. FIG. 8C is an enlarged view of the vicinity of the chamber-side interface 120 in FIG. 8B.

The chamber-side interface 120 has a substantially annular shape including a hollow part 121. For example, the tank 30 of the target generation device 12 is inserted into the hollow part 121. A fitting part 122 is integrally formed on the upper surface of the chamber-side interface 120. The fitting part 122 is fitted to the fitting part 149 formed in the target generation device 12. One of the fitting parts 122 and 149 includes a convex portion and the other includes a concave portion so that the fitting parts can be fitted to each other. The target generation device 12 is positioned in the Y direction when the fitting part 149 is fitted to the fitting part 122 of the chamber-side interface 120.

The fitting part 149 includes a pin hole 149a. The fitting part 122 includes a pin hole 122a at a position corresponding to the pin hole 149a of the fitting part 149. A positioning pin 170 is inserted into the pin holes 149a and 122a. Accordingly, the target generation device 12 is positioned in the rotational direction about the central axis L.

The connection part 39 of the target generation device 12 includes a through-hole 39c. The fitting part 149 includes a through-hole 149b at a position corresponding to the through-hole 39c. The fitting part 122 includes a tap hole 122b at a position corresponding to the through-hole 149b. The target generation device 12 is fixed to the chamber-side interface 120 when a fixation bolt 171 is screwed into the tap hole 122b through the through-holes 39c and 149b.

An O ring groove 149c is formed at a joining part between the target generation device 12 and the fitting part 149. The O ring groove 149c houses an O ring 172. Similarly, an O ring groove 122c is formed at a joining part between the fitting parts 149 and 122. The O ring groove 122c houses an O ring 173. The O rings 172 and 173 maintain air-tightness inside the chamber 10 when the target generation device 12 is fixed to the chamber-side interface 120.

2.2 Operation

Figure 9:
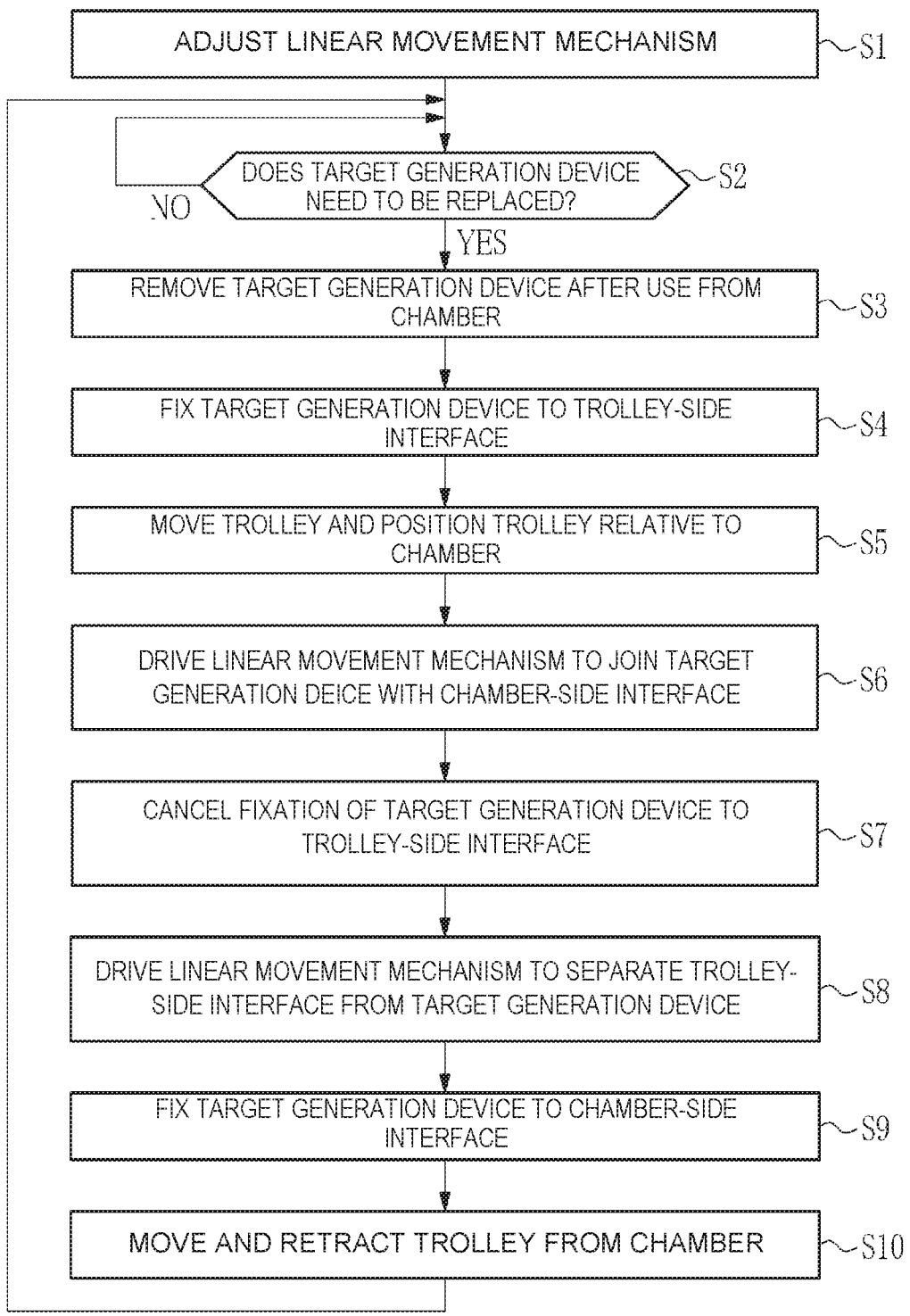
FIG. 9 is a flowchart for description of the procedure of replacing the target generation device.

The following describes a method of replacing the target generation device 12 by using the target generation device replacement system 100 configured as described above. The procedure of replacing the target generation device 12 will be described below with reference to a flowchart illustrated in FIG. 9.

Figure 10:
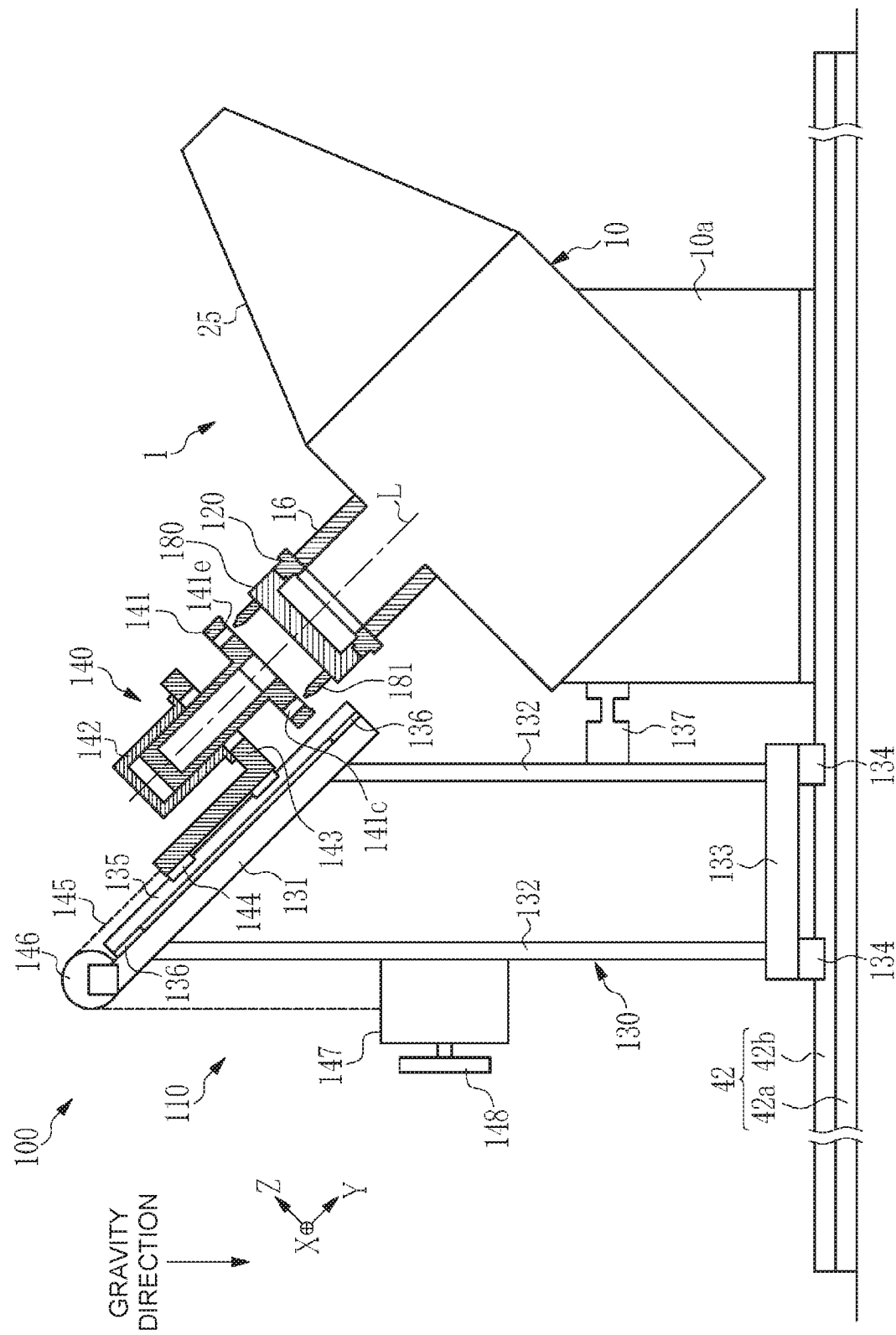
FIG. 10 is a diagram for description of a method of adjusting a linear movement mechanism.

The linear movement mechanism 140 is adjusted in advance before the target generation device 12 is replaced (step S1). Specifically, as illustrated in FIG. 10, first, a dummy member 180 of the target generation device 12 is attached to the chamber-side interface 120 of the chamber 10 disposed in the maintenance region. The dummy member 180 has a shape identical to that of the connection part 39 of the target generation device 12, and includes a guide pin 181 at an upper surface. The guide pin 181 is disposed at a position identical to that of the guide pin 39a formed at the connection part 39.

Subsequently, the trolley 110 is moved to contact the positioning portion 137 with the chamber mount 10a. Then, the winch 147 is operated and the linear movement mechanism 140 is driven to move down the movement supporter 143 in the Y direction so that the trolley-side interface 141 becomes close to the dummy member 180. In this state, the positions of the trolley-side interface 141 and the housing 142 are adjusted through the rotation adjustment mechanism and the translation adjustment mechanism so that the guide pin 181 enters into the pin holes 141c of the trolley-side interface 141.

In addition, the winch 147 is operated to move down the movement supporter 143, and the angle and height of the linear rail 135 are finely adjusted so that an upper end part of the dummy member 180 is fitted to the fitting part 141e of the trolley-side interface 141. This fine adjustment is performed through insertion/removal of the shim 136 as a rail adjustment member as described above.

In this manner, the trolley-side interface 141 and the linear rail 135 included in the linear movement mechanism 140 are positioned relative to the chamber-side interface 120 of the chamber 10. The adjustment of the linear movement mechanism 140 may be performed without using the dummy member 180 while the target generation device 12 is attached to the chamber-side interface 120.

Subsequently, it is determined as appropriate whether the target generation device 12 needs to be replaced in the EUV light generation device 1 in operation (step S2). For example, it is determined that the replacement is needed when the remaining amount of the target material housed in the tank 30 of the target generation device 12 becomes equal to or smaller than a predetermined amount. When the target generation device 12 is to be replaced (YES at step S2), the chamber 10 is moved to the maintenance region by the movement mechanism 42. Then, the target generation device 12 after use is removed from the mounting part 16 of the chamber 10 (step S3).

Figure 11:
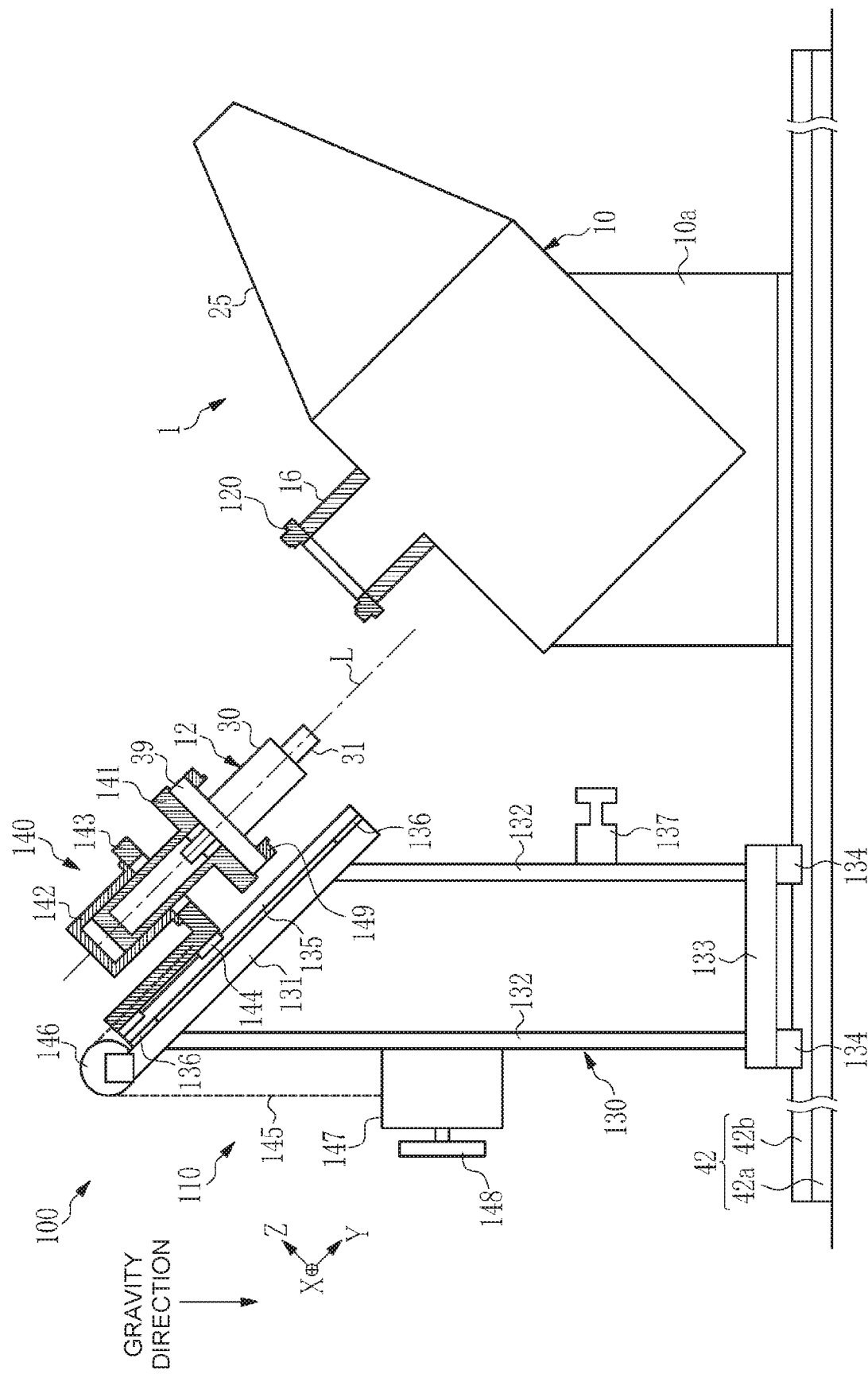
FIG. 11 is a diagram illustrating a state in which the target generation device is fixed to the trolley-side interface.

Subsequently, a new target generation device 12 is fixed to the trolley-side interface 141 as illustrated in FIG. 11 (step S4). Accordingly, the target generation device 12 is held by the movement mechanism 42 in a posture in which the target generation device 12 is mounted on the mounting part 16 of the chamber 10. The target generation device 12 is fixed to the trolley-side interface 141 by inserting the guide pins 39a into the pin holes 141c and screwing the fixation bolts 151 into the tap holes 39b through the through-holes 141d as illustrated in FIGS. 6A and 6B. This work may be performed while the trolley 110 is connected with the movement mechanism 42, but the trolley 110 to which the new target generation device 12 is attached may be conveyed from another place and connected with the movement mechanism 42.

Figure 12:
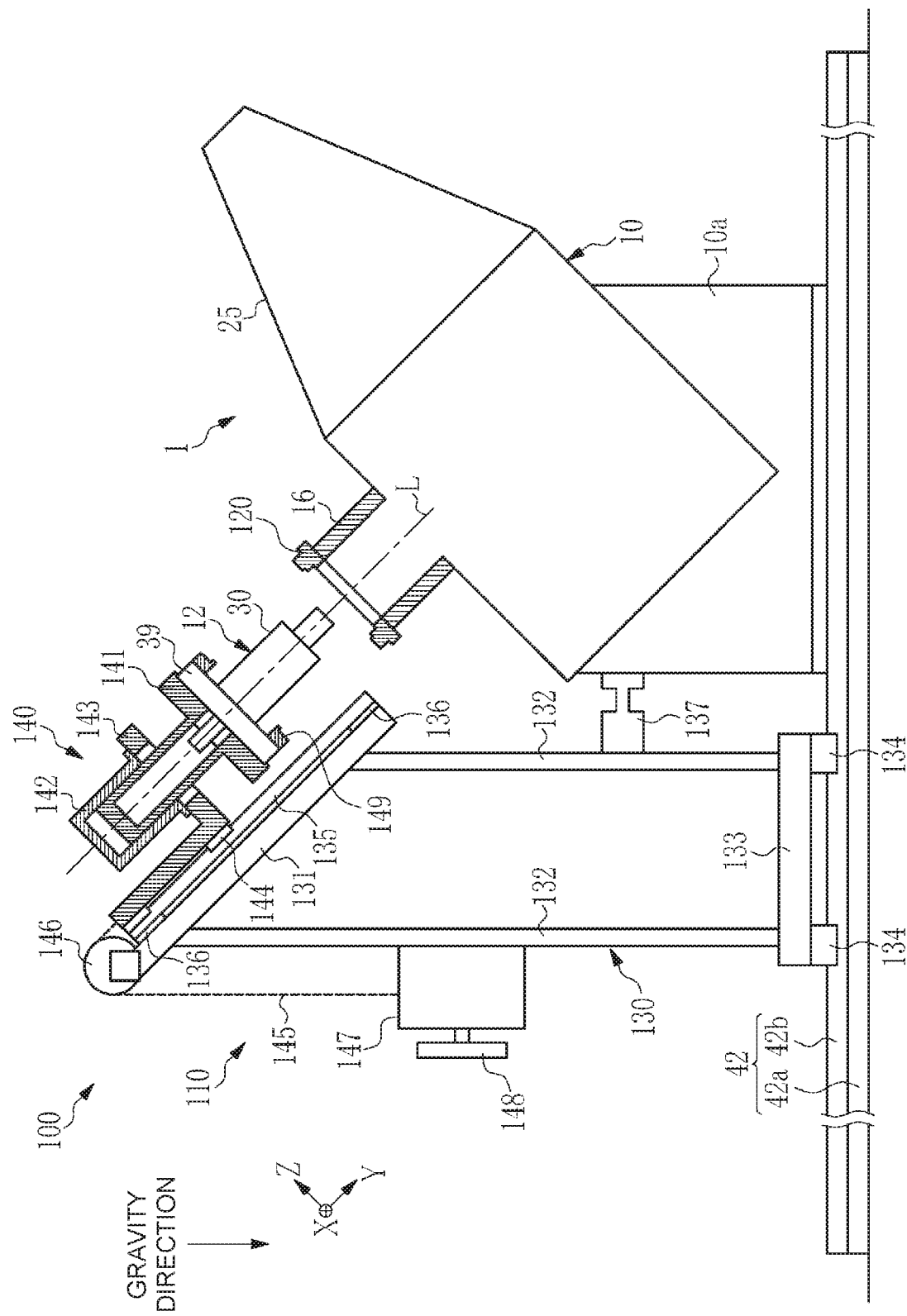
FIG. 12 is a diagram illustrating a state in which the trolley is positioned relative to the chamber.
Figure 13:
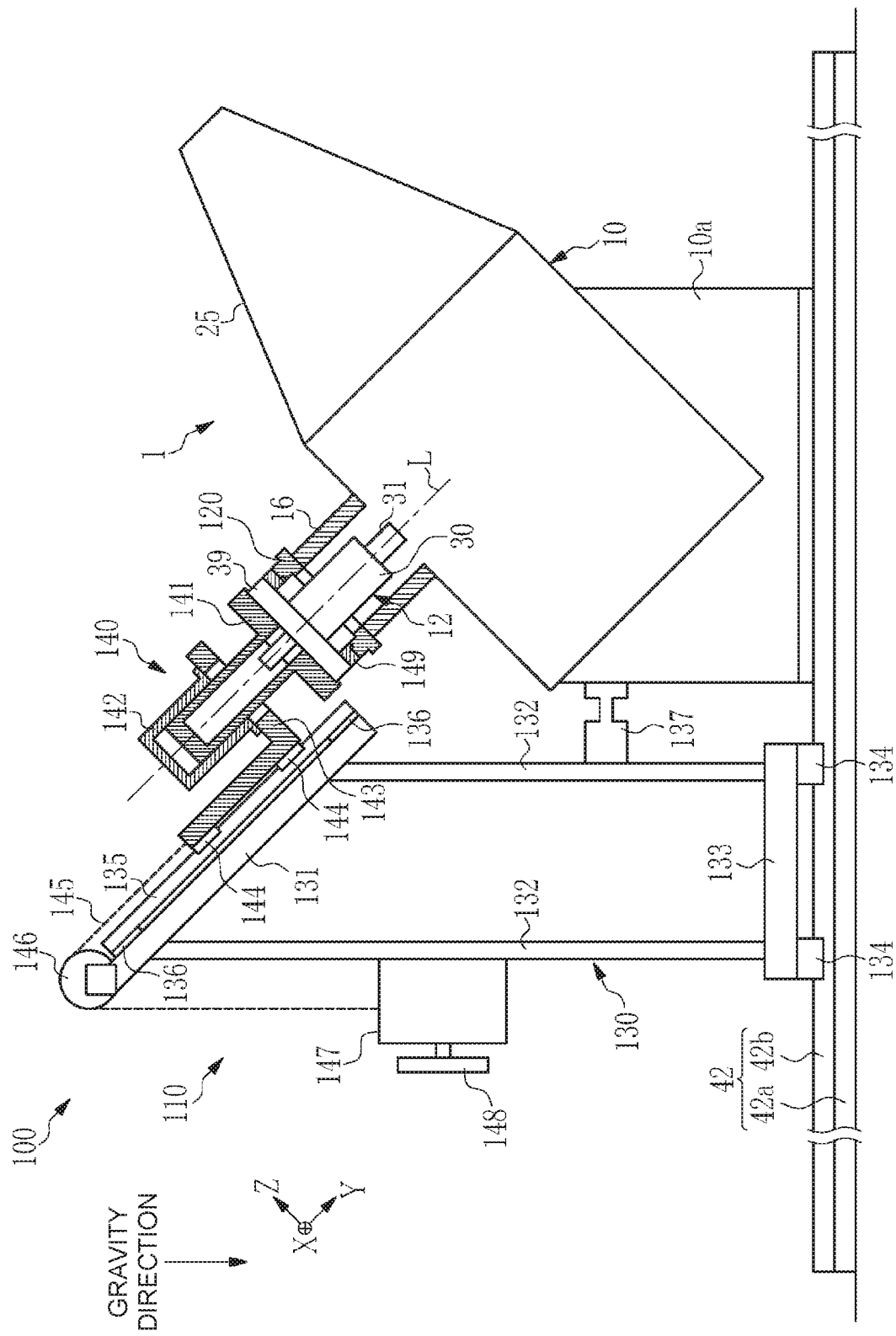
FIG. 13 is a diagram illustrating a state in which the target generation device is fitted to the chamber-side interface.

Subsequently, as illustrated in FIG. 12, the trolley 110 on which the target generation device 12 is mounted is moved by the movement mechanism 42 so that the positioning portion 137 contacts the chamber mount 10a to position the trolley 110 relative to the chamber 10 (step S5). In this state, the winch 147 is operated and the linear movement mechanism 140 is driven to move down the target generation device 12 in the Y direction, in other words, move the target generation device 12 toward the chamber 10 so that the target generation device 12 is joined with the chamber-side interface 120 as illustrated in FIG. 13 (step S6).

In this process, the fitting part 149 of the target generation device 12 is fitted to the fitting part 122 of the chamber-side interface 120. The positioning pin 170 is inserted into the pin hole 122a of the fitting part 122 in advance, and then inserted into the pin hole 149a of the fitting part 149 when the fitting parts 122 and 149 are fitted to each other. Since the position of the linear movement mechanism 140 is adjusted at step S1, the target generation device 12 is accurately fitted to the chamber-side interface 120 only by moving down the target generation device 12.

Figure 14:
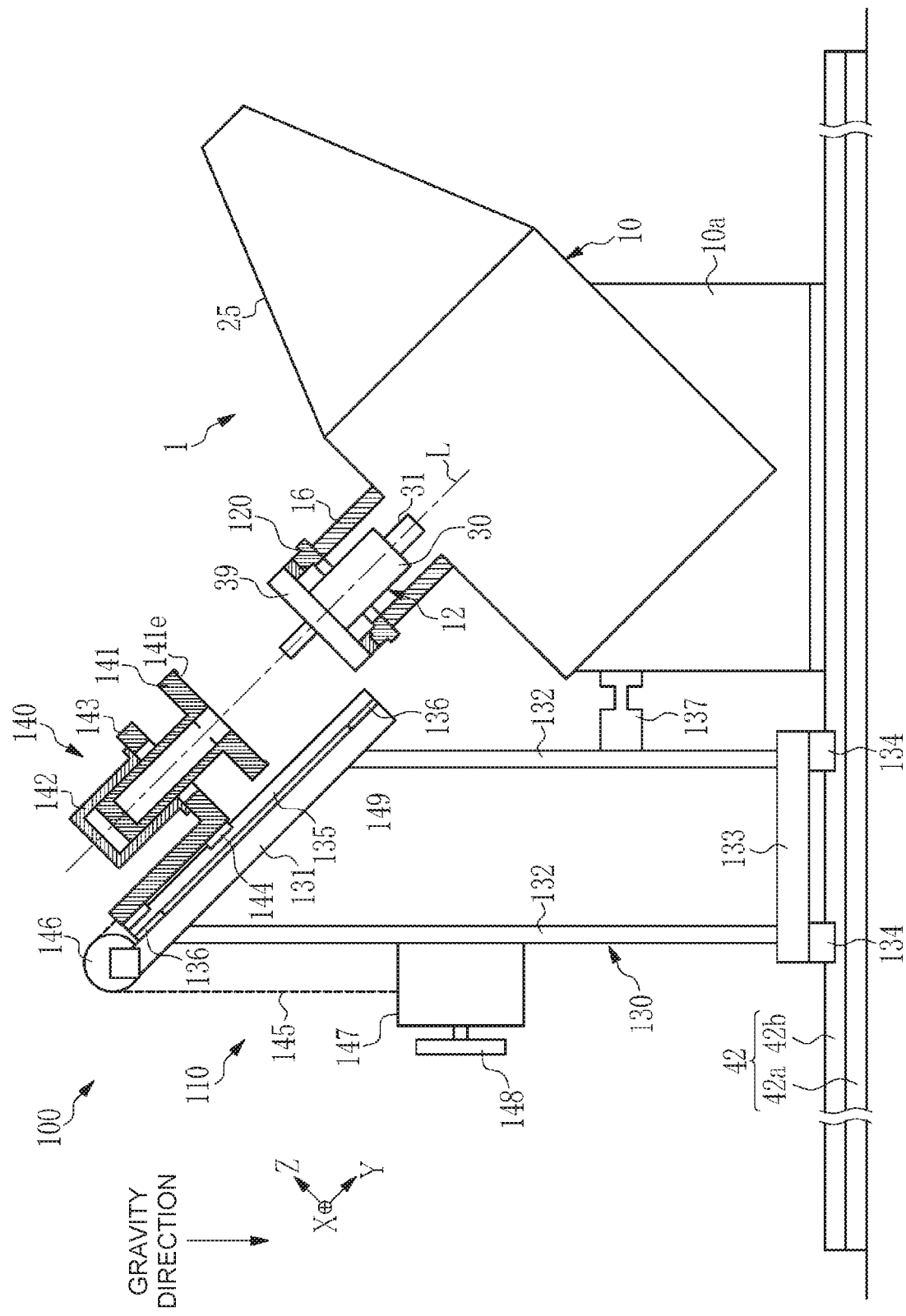
FIG. 14 is a diagram illustrating a state in which the trolley-side interface is separated from the target generation device.

Subsequently, while the target generation device 12 is fitted to the chamber-side interface 120, the fixation of the target generation device 12 to the trolley-side interface 141 is canceled (step S7). Specifically, the fixation bolt 150 screwed into the tap holes 39b at step S4 is removed. Then, the winch 147 is operated and the linear movement mechanism 140 is driven to move the trolley-side interface 141 toward the side opposite to the chamber 10 so that the trolley-side interface 141 is separated from the target generation device 12 as illustrated in FIG. 14 (step S8).

Figure 15:
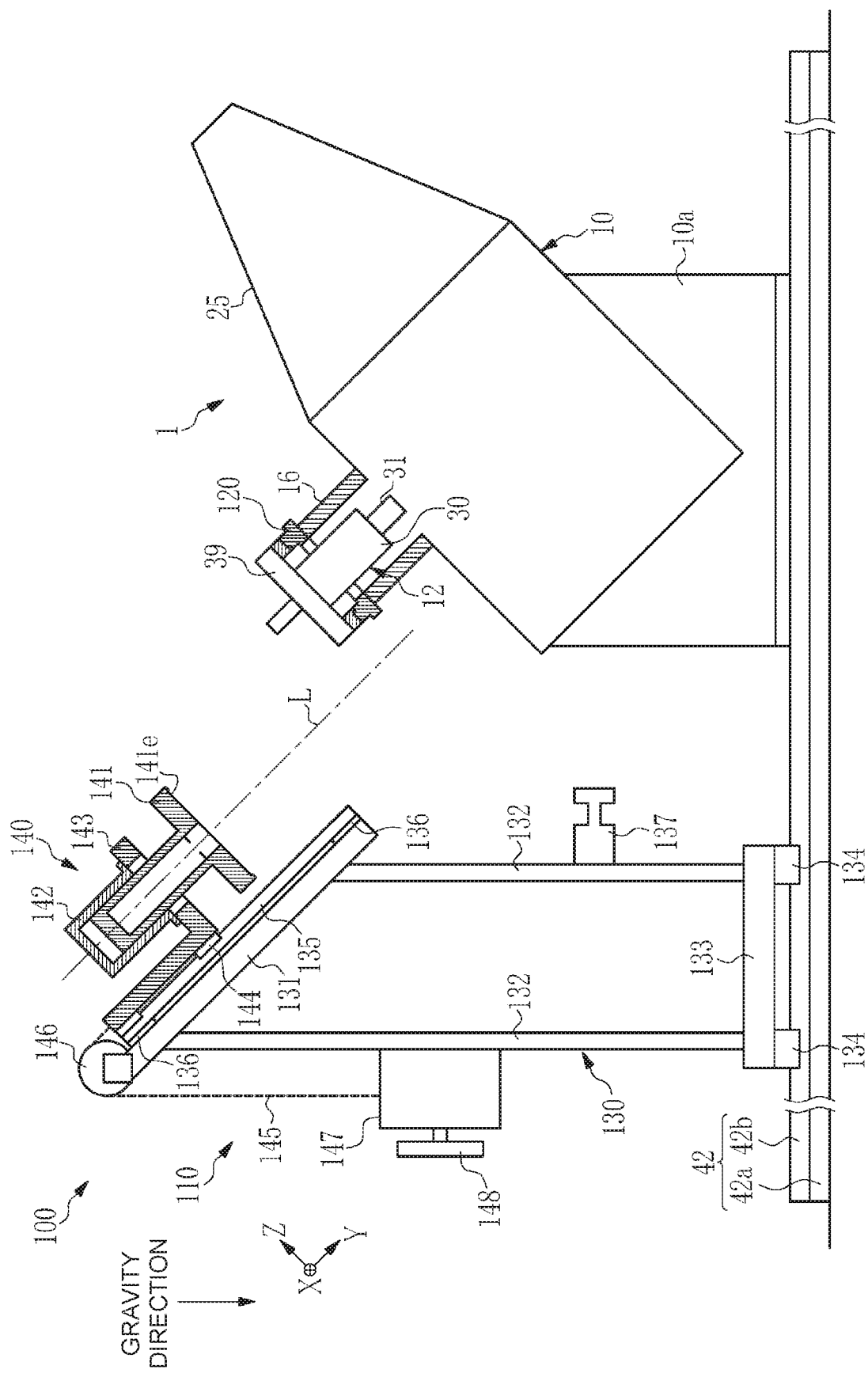
FIG. 15 is a diagram illustrating a state in which the trolley is retracted from the chamber.

Subsequently, as illustrated in FIGS. 8A and 8B, the target generation device 12 is fixed to the chamber-side interface 120 by screwing the fixation bolt 171 into the tap hole 122b (step S9). Accordingly, the target generation device 12 is fixed to the mounting part 16 of the chamber 10 through the chamber-side interface 120. Thereafter, as illustrated in FIG. 15, the trolley 110 is moved by the movement mechanism 42 and retracted from the chamber 10 (step S10). The trolley 110 may be moved to another place after cancellation of the connection with the movement mechanism 42.

Then, the target generation device 12 is connected with an interface (not illustrated), which completes the replacement work. This interface includes the joint 38 and electric wires for the heater 35, the temperature sensor 36, the piezoelectric element 37, and the like.

Thereafter, the EUV light generation device 1 is moved, by the movement mechanism 42, to a position at which the EUV light generation device 1 is connected with the exposure device 2, and then is operated. When the target generation device 12 needs to be replaced, the replacement work is performed again through the above-described procedure.

The removal work of the target generation device 12 after use at step S3 can be performed by inversely executing the above-described procedure of attaching the target generation device 12. When simply described, first, the trolley 110 is positioned relative to the chamber 10, and the fixation of the target generation device 12 to the chamber-side interface 120 is canceled.

Then, the linear movement mechanism 140 is driven to move down the trolley-side interface 141 so that the trolley-side interface 141 joins with the target generation device 12. In this state, the target generation device 12 is fixed to the trolley-side interface 141.

Subsequently, the linear movement mechanism 140 is driven to move up the target generation device 12 together with the trolley-side interface 141 so that the target generation device 12 becomes separated from the chamber 10. Then, after the trolley 110 is moved and separated from the chamber 10, the target generation device 12 is removed from the trolley-side interface 141. This completes the removal work of the target generation device 12.

2.3 Effect

In the first embodiment, the target generation device 12 is mounted on the linear movement mechanism 140 of the trolley 110, and the linear movement mechanism 140 is driven to enable connection of the target generation device 12 to the chamber 10. Accordingly, even when the weight of the tank 30 of the target generation device 12 is increased due to increase in the capacity, the worker can still easily replace the target generation device 12.

3. Second Embodiment

The following describes a target generation device replacement system according to a second embodiment of the present disclosure. In the second embodiment, the target generation device 12 is replaced for an EUV light generation device 1a in which the mounting part 16 of the chamber 10 is disposed differently from that in the EUV light generation device 1 of the first embodiment. Hereinafter, any component same as that of the first embodiment is denoted by an identical reference sign, and description thereof is omitted as appropriate.

3.1 Configuration 3.1.1 EUV Light Generation Device

Figure 16:
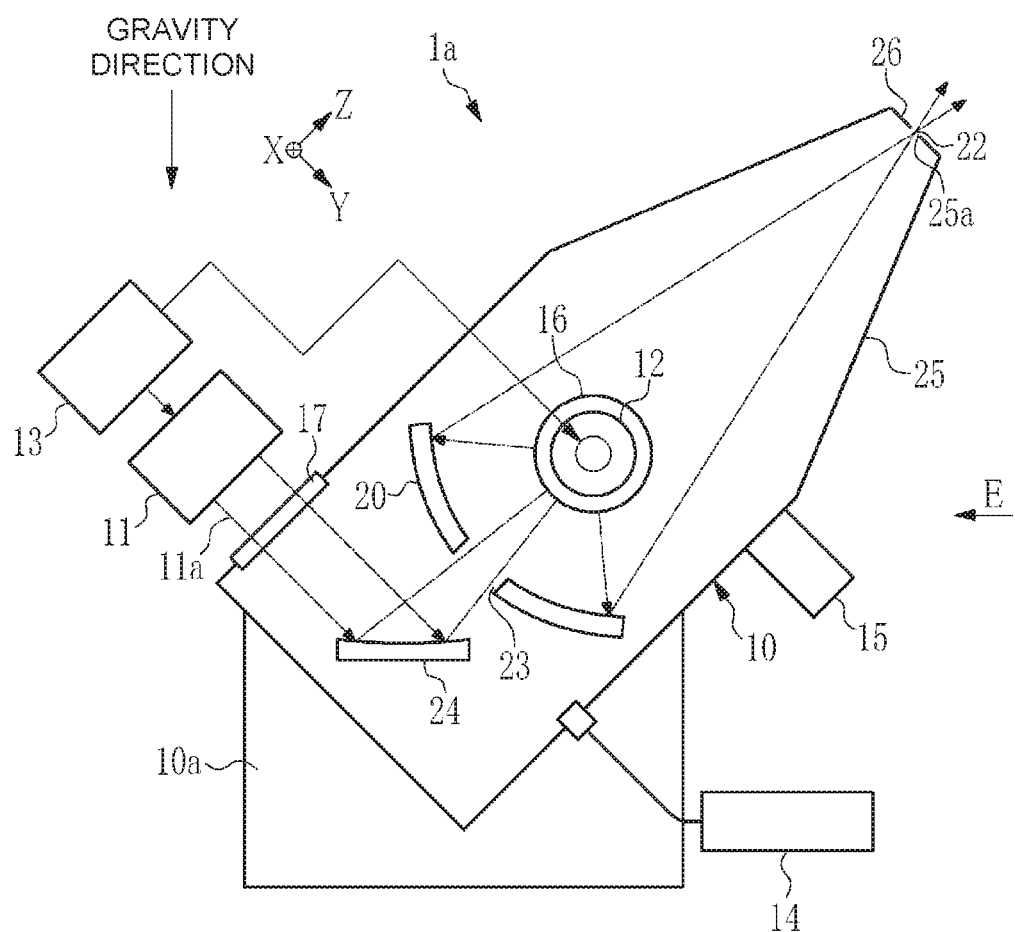
FIG. 16 is a schematic view illustrating the configuration of an EUV light generation device according to a second embodiment.

FIG. 16 schematically illustrates the configuration of the EUV light generation device 1a according to the second embodiment. The EUV light generation device 1a is same as the EUV light generation device 1 according to the first embodiment except that the position of the mounting part 16 provided relative to the chamber 10 is different. In FIG. 16, the mounting part 16 is rotated from the position thereof in the first embodiment about the Z direction as the direction of the optical axis of the EUV light by 90 degrees.

With this configuration, in the second embodiment, the mounting part 16 is provided to the chamber 10 to hold the target generation device 12 in a posture in which the output direction of the droplet DL aligns with the horizontal direction orthogonal to the direction of gravity. In the second embodiment, the output direction of the droplet DL output from the target generation device 12 aligns with the X direction.

3.1.2 Target Generation Device Replacement System

Figure 17:
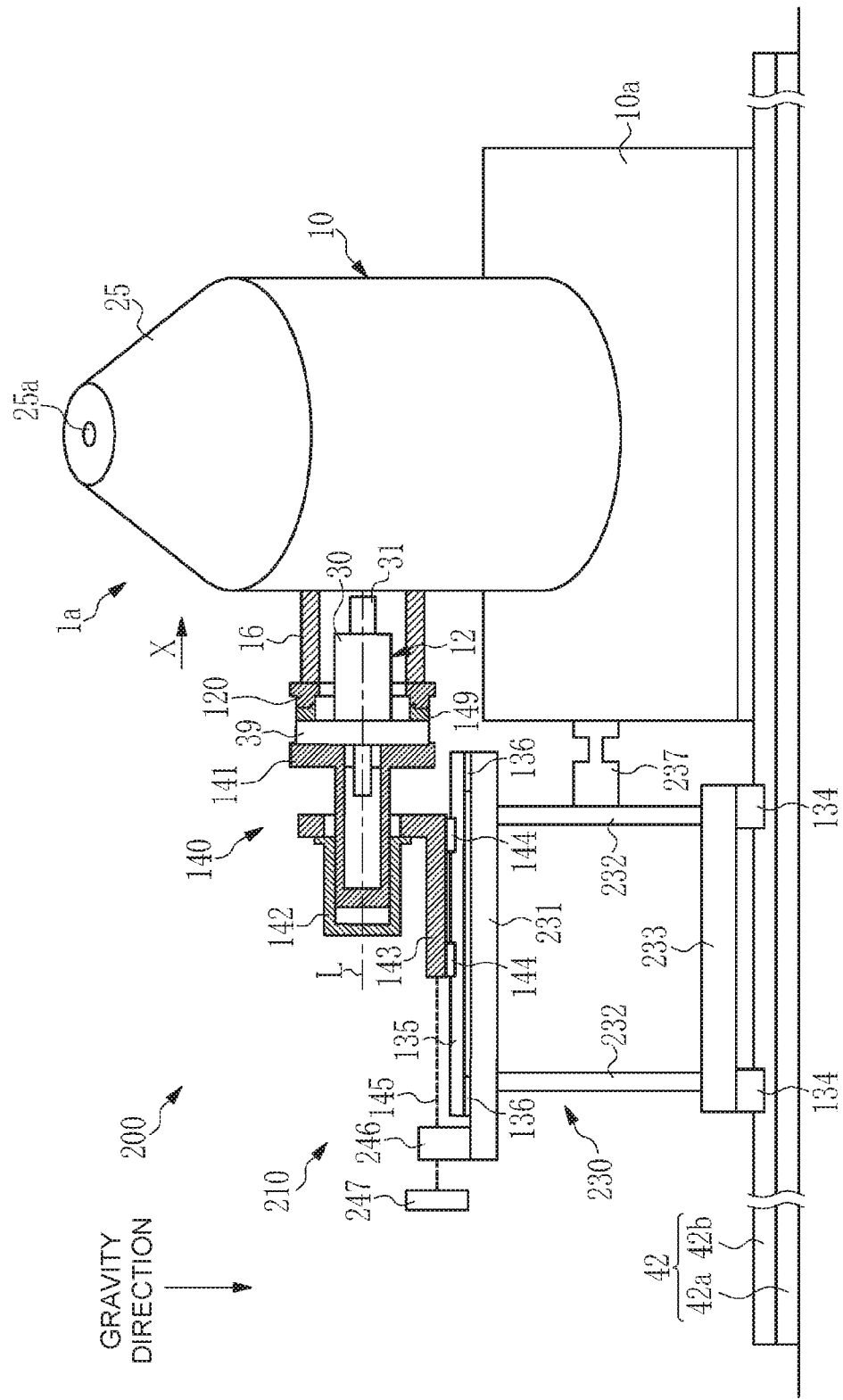
FIG. 17 is a schematic view illustrating the configuration of a target generation device replacement system according to the second embodiment.

FIG. 17 schematically illustrates the configuration of a target generation device replacement system 200 according to the second embodiment. FIG. 17 is a diagram of the EUV light generation device 1a when viewed in E direction illustrated in FIG. 16. The target generation device replacement system 200 includes a target generation device replacement trolley 210 and the chamber-side interface 120. The chamber-side interface 120 has a configuration same as that in the first embodiment.

The trolley 210 includes a mount 230 and the linear movement mechanism 140. The linear movement mechanism 140 has a configuration same as that in the first embodiment. FIG. 17 illustrates a cross-sectional view of the linear movement mechanism 140 and the mounting part 16 taken along a plane parallel to the direction of gravity and the X direction.

The mount 230 includes a flat plate table 231, a plurality of frames 232, and a base 233. Unlike the first embodiment, the flat plate table 231 is supported by the frames 232 so that the upper surface thereof aligns with a horizontal plane orthogonal to the direction of gravity. Similarly to the first embodiment, the base 233 supporting the frames 232 is held by the sliders 134. The mount 230 is slidable along the linear rail 42b.

Similarly to the first embodiment, the trolley 210 is provided with a positioning portion 237. The positioning portion 237 is attached to, for example, the frames 232. The trolley 210 is positioned relative to the chamber 10 when the positioning portion 237 contacts the chamber mount 10a.

Similarly to the first embodiment, one or a plurality of linear rails 135 are provided on the upper surface of the table 231. In the present embodiment, each linear rail 135 is substantially parallel to the X direction. The angle and height of the linear rail 135 can be finely adjusted by the shim 136.

The linear movement mechanism 140 is connected movably in the X direction with the linear rail 135. The linear movement mechanism 140 includes the trolley-side interface 141, the housing 142, and the movement supporter 143. The linear movement mechanism 140 has a configuration same as that in the first embodiment, and thus detailed description thereof is omitted.

The movement supporter 143 is slidably engaged with the linear rail 135 through the sliders 144. The movement supporter 143 is movable in the X direction. The movement supporter 143 has an end part connected with one end of the line member 145. In the present embodiment, the line member 145 is, for example, a ball screw. The pulley 146 and the winch 147 described in the first embodiment are not provided, but a bearing 246 and a handle 247 are provided in place thereof. The other end of the line member 145 is connected with the handle 247 through the bearing 246. In the present embodiment, the line member 145, the bearing 246, and the handle 247 constitute the drive unit of the linear movement mechanism 140.

The linear movement mechanism 140 can be moved along the linear rail 135 by rotating the handle 148. The bearing 246 and the handle 247 may be replaced with a pulley and a winch similar to those in the first embodiment.

3.2 Operation

A method of replacing the target generation device 12 by the target generation device replacement system 200 for the EUV light generation device 1a is same as that of the first embodiment except that the target generation device 12 is moved in a different direction by the linear movement mechanism 140. Thus, description is omitted for the procedure of replacing the target generation device 12.

The above description is intended to provide not restriction but examples. Thus, the skilled person in the art would clearly understand that the embodiments of the present disclosure may be changed without departing from the scope of the claims.

The terms used throughout the description and the appended claims are to be construed as "open-ended" terms. For example, the term "includes/include/including" or "included" is to be construed as "including but not limited to". The term "has/have/having" is to be construed as "having but not limited to". In addition, the indefinite article "a/an" described in the description and recited in the appended claims is to be construed to mean "at least one" or "one or more".

What is claimed is:

1. A target generation device replacement trolley comprising:
   A. a linear movement mechanism configured to hold a target generation device configured to output a target material and linearly move the target generation device in a direction in which the target material is output; and
   B. a positioning portion configured to position the linear movement mechanism relative to a mounting part of a chamber on which the target generation device is mounted.

2. The target generation device replacement trolley according to claim 1, further comprising:
   C. a drive unit configured to drive the linear movement mechanism.

3. The target generation device replacement trolley according to claim 2, further comprising:
   D. a mount configured to hold the linear movement mechanism,
   wherein the positioning portion is provided to the mount.

4. The target generation device replacement trolley according to claim 3, wherein the mount movably holds the linear movement mechanism through a linear rail.

5. The target generation device replacement trolley according to claim 1, wherein the linear movement mechanism includes a trolley-side interface to which the target generation device is detachably fixed, and a housing holding the trolley-side interface.

6. The target generation device replacement trolley according to claim 5, wherein the housing includes a rotation adjustment mechanism with which the trolley-side interface is rotated about a moving direction of the linear movement mechanism.

7. The target generation device replacement trolley according to claim 6, wherein the housing includes a translation adjustment mechanism with which the trolley-side interface is translated in a direction orthogonal to the moving direction.

8. The target generation device replacement trolley according to claim 7, wherein the trolley-side interface includes a fitting part to which part of the target generation device is fitted and with which the target generation device is positioned in the moving direction.

9. The target generation device replacement trolley according to claim 8, wherein the trolley-side interface includes a pin hole into which a guide pin provided to the target generation device is inserted and with which the target generation device is positioned in a rotational direction about the moving direction.

10. The target generation device replacement trolley according to claim 1, wherein a moving direction of the linear movement mechanism is not parallel nor orthogonal to the direction of gravity.

11. The target generation device replacement trolley according to claim 1, wherein a moving direction of the linear movement mechanism is orthogonal to the direction of gravity.

12. A target generation device replacement system comprising:
 A. a target generation device replacement trolley including
  A1. a linear movement mechanism configured to hold a target generation device configured to output a target material and linearly move the target generation device in a direction in which the target material is output, and
  A2. a positioning portion configured to position the linear movement mechanism relative to a mounting part of a chamber on which the target generation device is mounted; and
 B. a chamber-side interface that is provided to the mounting part and to which the target generation device is detachably fixed.

13. The target generation device replacement system according to claim 12, wherein the linear movement mechanism includes a trolley-side interface to which the target generation device is detachably fixed, and a housing holding the trolley-side interface.

14. The target generation device replacement system according to claim 13, wherein the trolley-side interface includes a fitting part to which part of the target generation device is fitted and with which the target generation device is positioned in a moving direction of the linear movement mechanism.

15. The target generation device replacement system according to claim 14, wherein the trolley-side interface includes a pin hole into which a guide pin provided to the target generation device is inserted and with which the target generation device is positioned in a rotational direction about the moving direction.

16. The target generation device replacement system according to claim 13, wherein the chamber-side interface includes a fitting part to which part of the target generation device is fitted and with which the target generation device is positioned in a moving direction of the linear movement mechanism.

17. The target generation device replacement system according to claim 16, wherein the chamber-side interface includes a pin hole into which a positioning pin is inserted and with which the target generation device is positioned in a rotational direction about the moving direction.

18. The target generation device replacement system according to claim 12, further comprising:
 C. a trolley movement mechanism configured to move the target generation device replacement trolley relative to the chamber.

19. A target generation device replacement method comprising:
 A. fixing a target generation device to a linear movement mechanism provided to a target generation device replacement trolley, the target generation device being configured to output a target material;
 B. positioning the target generation device replacement trolley relative to a chamber on which the target generation device is mounted;
 C. driving the linear movement mechanism to join the target generation device with the chamber; and
 D. canceling the fixation between the linear movement mechanism and the target generation device.

20. The target generation device replacement method according to claim 19, further comprising:
 E. canceling the joining between the chamber and the target generation device;
 F. driving the linear movement mechanism to join the target generation device with the linear movement mechanism;
 G. fixing the target generation device to the linear movement mechanism; and
 H. driving the linear movement mechanism to separate the target generation device from the chamber.

* * * * *